(12) United States Patent
Huang et al.

(10) Patent No.: US 12,021,119 B2
(45) Date of Patent: Jun. 25, 2024

(54) SELECTIVE LINER ON BACKSIDE VIA AND METHOD THEREOF

(71) Applicant: Taiwan Semiconductor Manufacturing Co., Ltd., Hsinchu (TW)

(72) Inventors: Lin-Yu Huang, Hsinchu (TW); Li-Zhen Yu, Hsinchu (TW); Chia-Hao Chang, Hsinchu (TW); Cheng-Chi Chuang, New Taipei (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/358,576

(22) Filed: Jul. 25, 2023

(65) Prior Publication Data
US 2023/0369401 A1    Nov. 16, 2023

Related U.S. Application Data

(60) Continuation of application No. 17/750,600, filed on May 23, 2022, now Pat. No. 11,742,385, which is a
(Continued)

(51) Int. Cl.
*H01L 29/08*    (2006.01)
*H01L 23/528*    (2006.01)
(Continued)

(52) U.S. Cl.
CPC ...... *H01L 29/0843* (2013.01); *H01L 29/0649* (2013.01); *H01L 29/785* (2013.01); *H01L 23/528* (2013.01)

(58) Field of Classification Search
CPC ............ H01L 29/0843; H01L 29/0649; H01L 29/785; H01L 23/528; H01L 21/76831;
(Continued)

(56) References Cited

U.S. PATENT DOCUMENTS

| 8,772,109 B2 | 7/2014 | Colinge |
| 8,785,285 B2 | 7/2014 | Tsai |

(Continued)

FOREIGN PATENT DOCUMENTS

| DE | 112015006959 T5 | 6/2018 |
| DE | 102020103515 A1 | 9/2020 |

(Continued)

OTHER PUBLICATIONS

Lou, Qiaowei, et al., "Optical Emission Spectroscopic Studies and Comparisons of CH3F/CO2 and CH3F/O2 Inductively Coupled Plasmas", Plasma Processing Laboratory, Department of Chemical and Biomolecular Engineering X University of Houston, Manuscript# JVSTA-A-14-332.
(Continued)

Primary Examiner — Jonathan Han
(74) Attorney, Agent, or Firm — Haynes and Boone, LLP

(57) ABSTRACT

A semiconductor structure includes a source/drain (S/D) feature; one or more channel semiconductor layers connected to the S/D feature; a gate structure engaging the one or more channel semiconductor layers; a first silicide feature at a frontside of the S/D feature; a second silicide feature at a backside of the S/D feature; and a dielectric liner layer at the backside of the S/D feature, below the second silicide feature, and spaced away from the second silicide feature by a first gap.

20 Claims, 36 Drawing Sheets

Related U.S. Application Data division of application No. 16/944,263, filed on Jul. 31, 2020, now Pat. No. 11,342,413.

(60) Provisional application No. 63/015,322, filed on Apr. 24, 2020.

(51) Int. Cl.
*H01L 29/06* (2006.01)
*H01L 29/78* (2006.01)

(58) Field of Classification Search
CPC .......... H01L 21/76897; H01L 23/5286; H01L 29/165; H01L 29/41766; H01L 29/66545; H01L 29/7848; H01L 2221/1063; H01L 29/0653; H01L 29/0673; H01L 29/4175; H01L 29/42392; H01L 29/66439; H01L 29/665; H01L 29/78618; H01L 29/78696; H01L 29/775; H01L 21/823475; H01L 21/28518; H01L 21/30625; H01L 21/3065; H01L 21/76898; H01L 21/823412; H01L 21/823425; H01L 21/823437; H01L 21/823462; H01L 29/7855; H01L 29/0603; H01L 29/0642; H01L 29/0684; H01L 29/66477; B82Y 10/00
See application file for complete search history.

(56) References Cited

U.S. PATENT DOCUMENTS

| | | |
|---|---|---|
| 8,802,504 B1 | 8/2014 | Hou |
| 8,803,292 B2 | 8/2014 | Chen |
| 8,803,316 B2 | 8/2014 | Lin |
| 8,816,444 B2 | 8/2014 | Wann |
| 8,823,065 B2 | 9/2014 | Wang |
| 8,860,148 B2 | 10/2014 | Hu |
| 8,993,380 B2 | 3/2015 | Hou |
| 9,105,490 B2 | 8/2015 | Wang |
| 9,236,267 B2 | 1/2016 | De |
| 9,236,300 B2 | 1/2016 | Liaw |
| 9,281,254 B2 | 3/2016 | Yu |
| 9,299,649 B2 | 3/2016 | Chiu |
| 9,372,206 B2 | 6/2016 | Wu |
| 9,425,126 B2 | 8/2016 | Kuo |
| 9,443,783 B2 | 9/2016 | Lin |
| 9,496,189 B2 | 11/2016 | Yu |
| 9,520,482 B1 | 12/2016 | Chang |
| 9,576,814 B2 | 2/2017 | Wu |
| 9,704,835 B2 | 7/2017 | Fong |
| 9,711,555 B2 | 7/2017 | Liu |
| 9,818,872 B2 | 11/2017 | Ching |
| 9,887,269 B2 | 2/2018 | Ching |
| 9,899,398 B1 | 2/2018 | Colinge |
| 10,020,261 B2 | 7/2018 | Wu |
| 10,032,627 B2 | 7/2018 | Lee |
| 10,090,193 B1 * | 10/2018 | Chanemougame ............ H01L 21/823821 |
| 10,109,721 B2 | 10/2018 | Lin |
| 10,157,799 B2 | 12/2018 | Ching |
| 10,199,502 B2 | 2/2019 | Huang |
| 10,243,053 B1 * | 3/2019 | Xie .......... H01L 29/785 |
| 10,269,715 B2 | 4/2019 | Wu |
| 10,282,504 B2 | 5/2019 | Wu |
| 11,152,475 B2 | 10/2021 | Huang |
| 11,201,186 B2 | 12/2021 | Tanaka |
| 11,222,892 B2 | 1/2022 | Su |
| 11,316,023 B2 | 4/2022 | Huang |
| 11,443,957 B2 | 9/2022 | Lin |
| 2014/0332749 A1 | 11/2014 | Yokoyama |
| 2018/0175036 A1 | 6/2018 | Ching |
| 2019/0097006 A1 * | 3/2019 | Li .......... H01L 29/66795 |
| 2019/0221649 A1 | 7/2019 | Glass |
| 2020/0083352 A1 | 3/2020 | Chanemougame |
| 2022/0013453 A1 | 1/2022 | Chen |

FOREIGN PATENT DOCUMENTS

| | | |
|---|---|---|
| JP | 2010171166 A | 8/2010 |
| KR | 20190015269 A | 2/2019 |

OTHER PUBLICATIONS

Michallet, Jean-Eric, et al. "CoolCube: A True 3DVLSI Alternative to Scaling", Mar. 24, 2015, 3DInCities. https://www.3dincites.com/2015/03/coolcube-a-true-3dvlsi-alternative-to-scaling/.

* cited by examiner

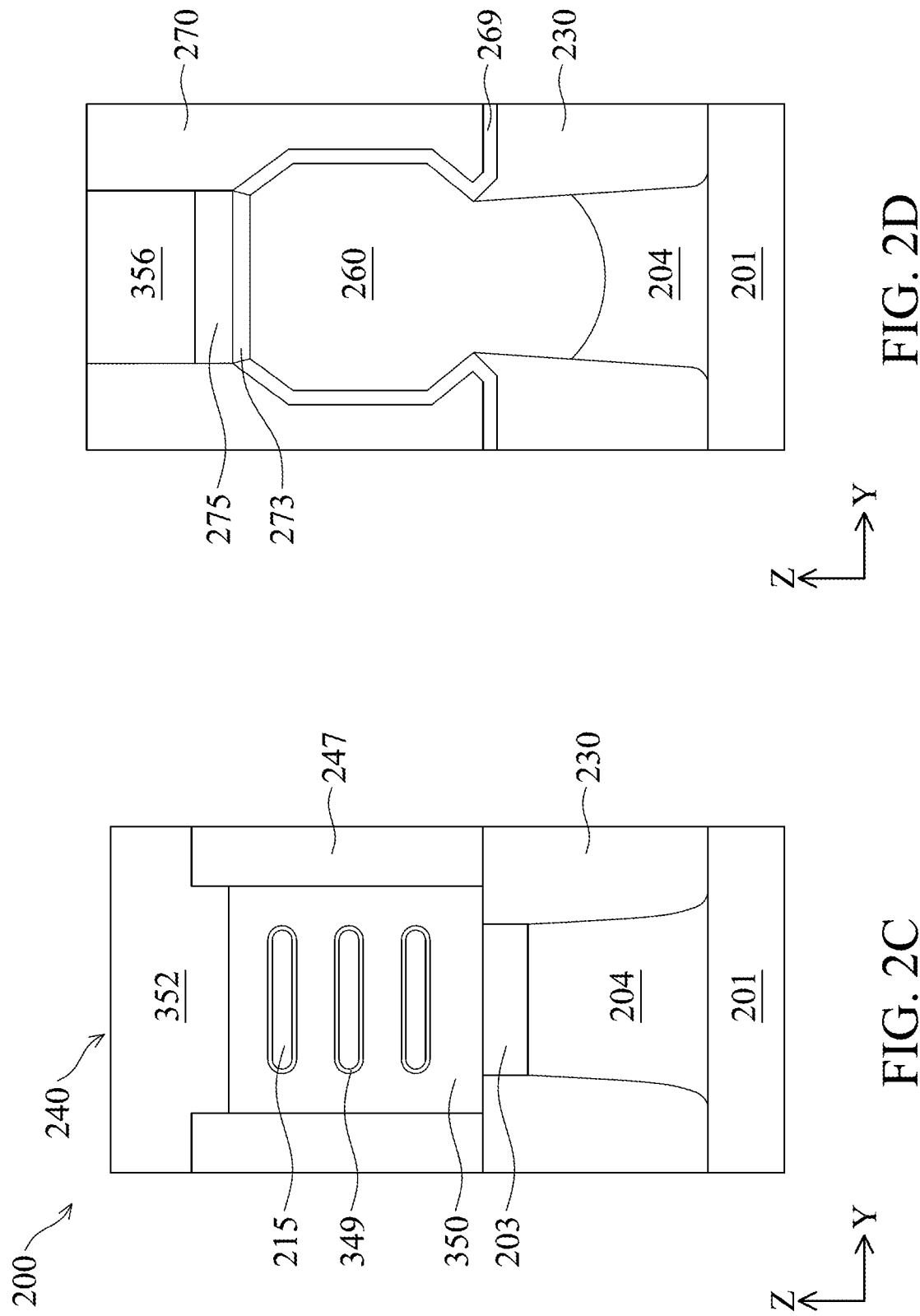

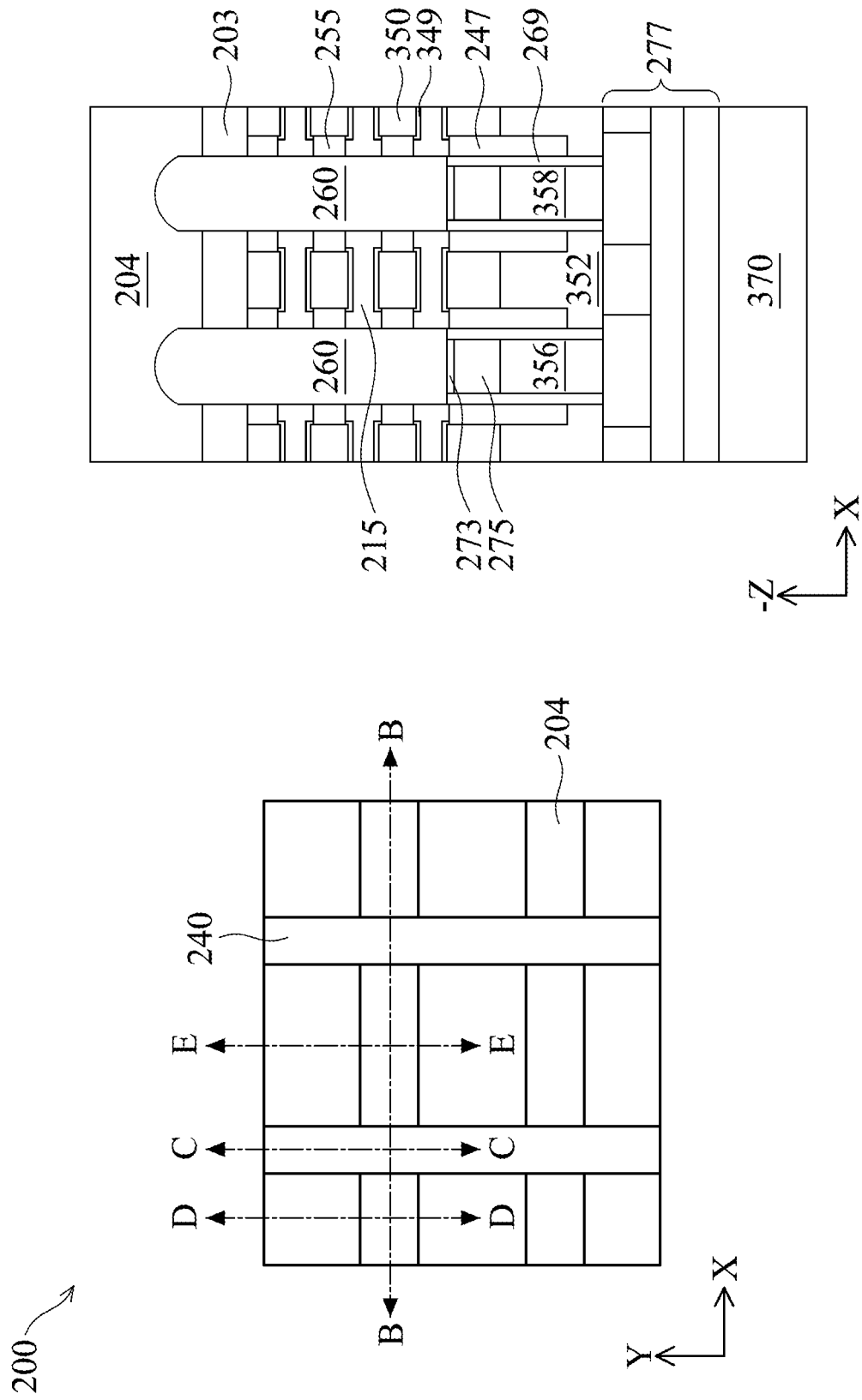

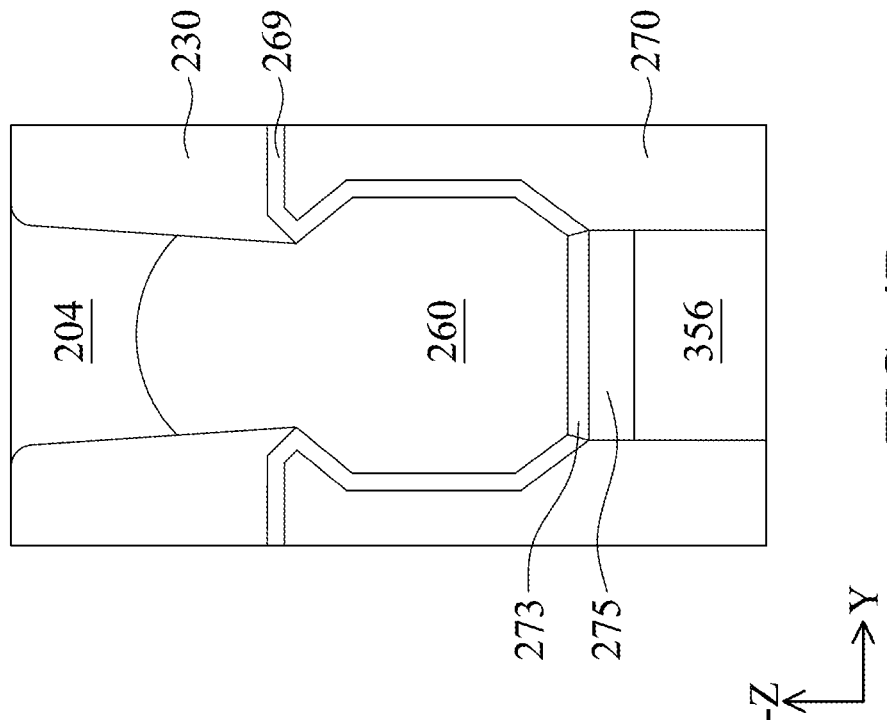
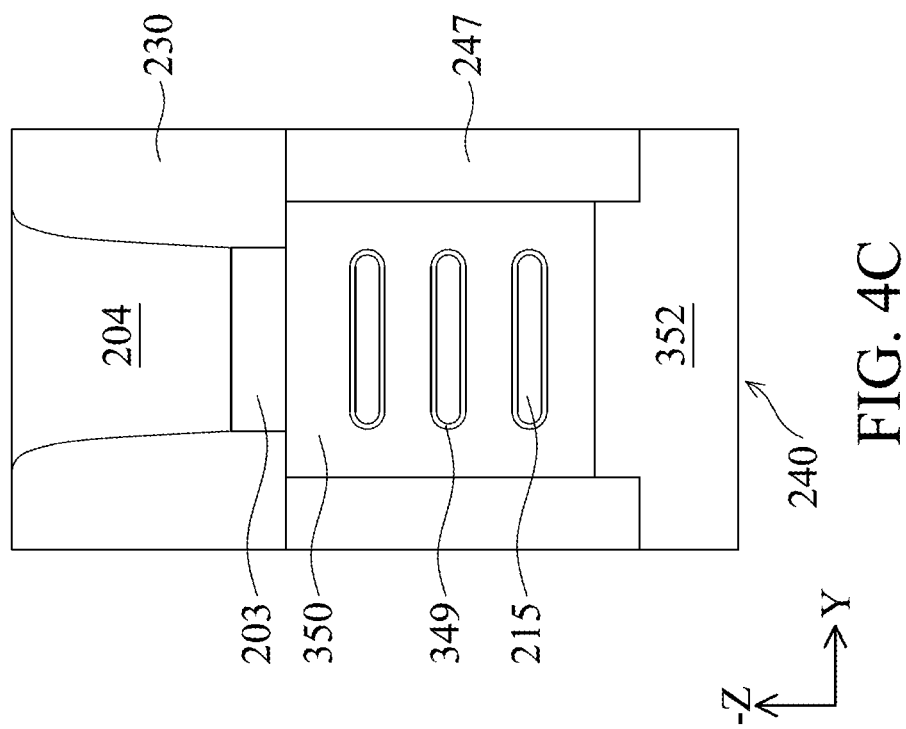

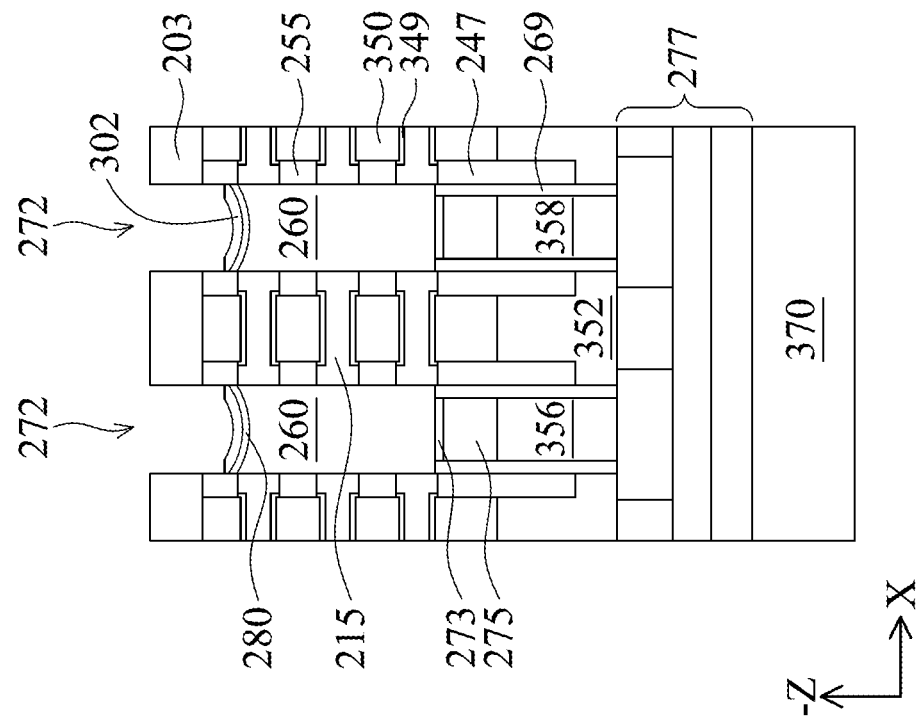
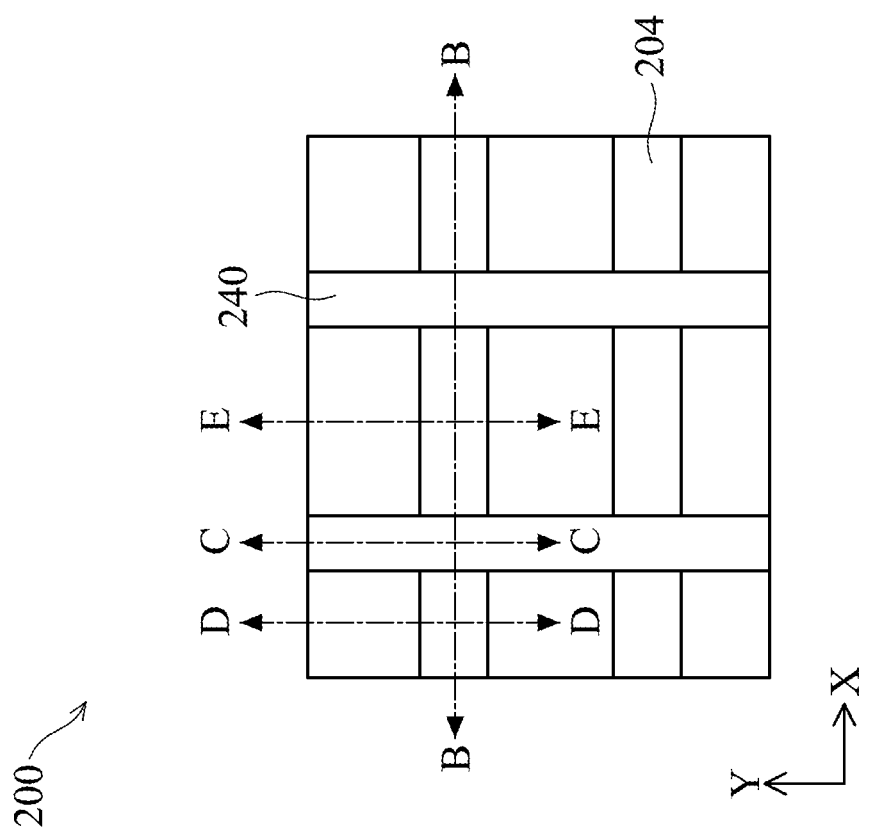
FIG. 6B
FIG. 6A

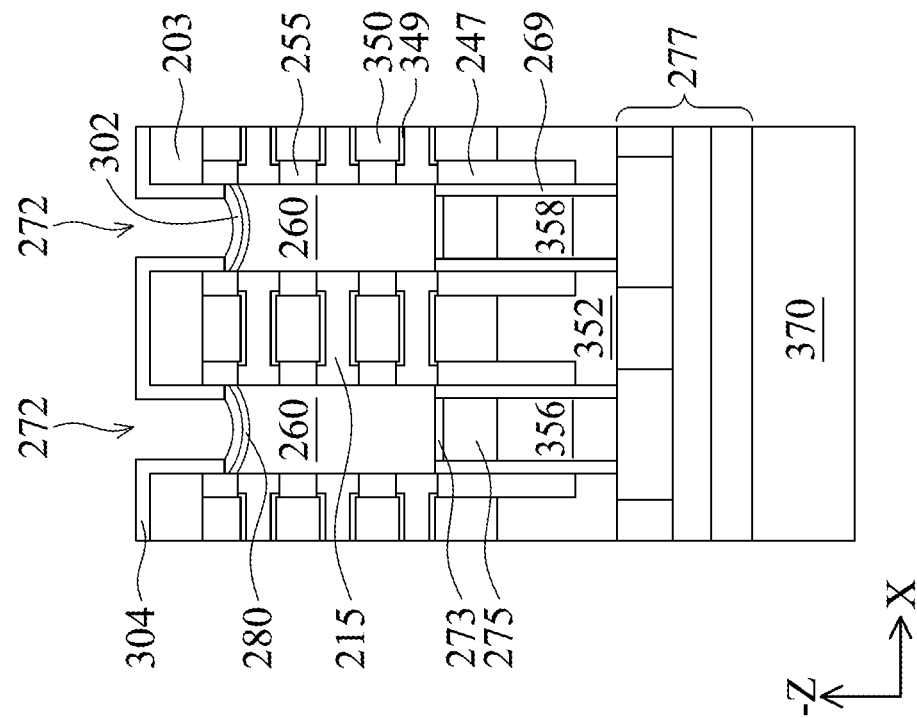
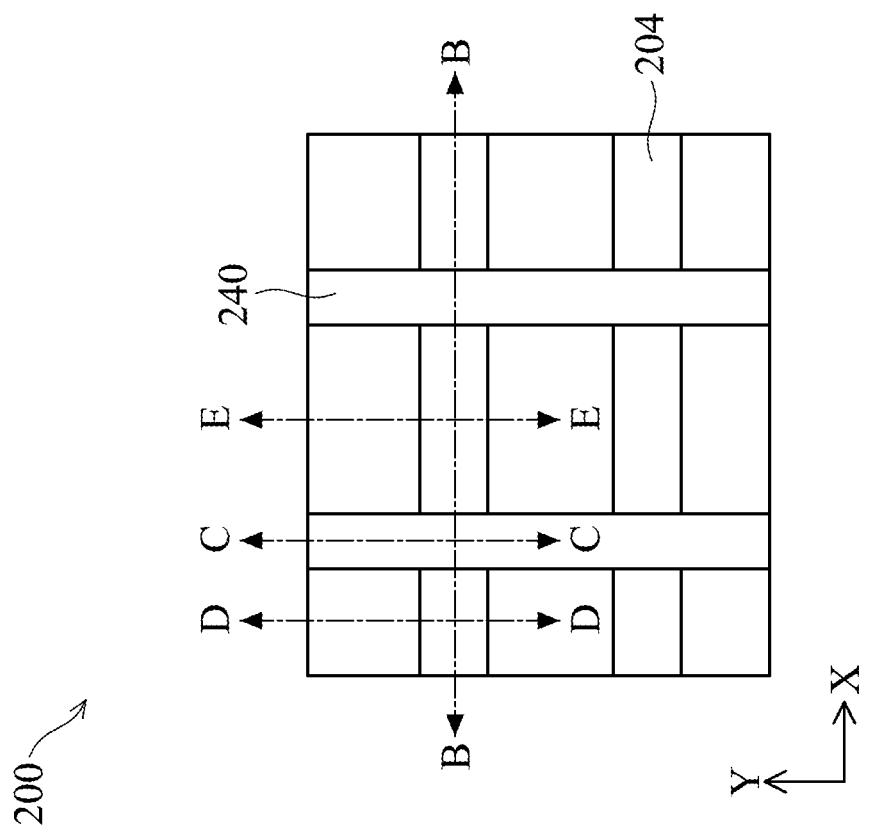
FIG. 7A
FIG. 7B

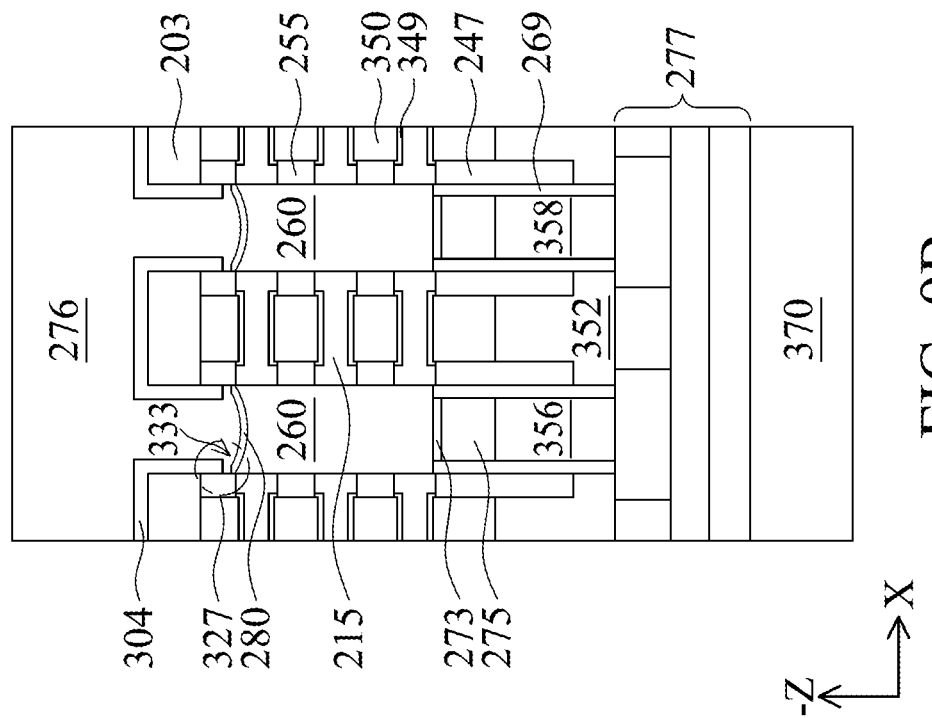
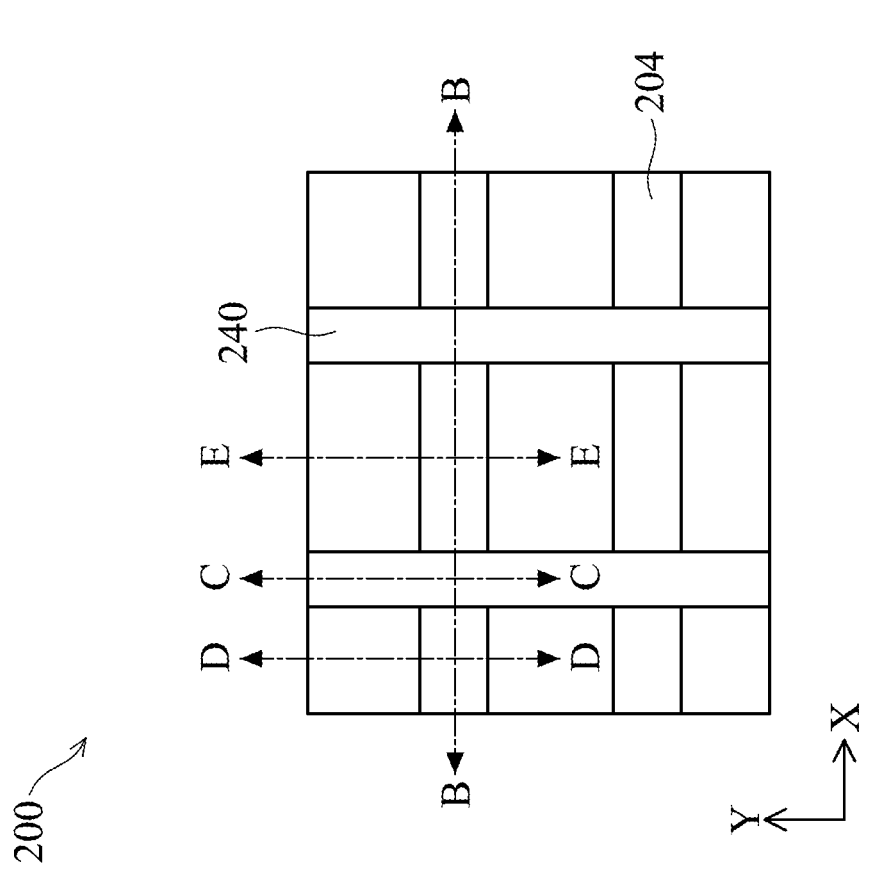
FIG. 9B
FIG. 9A

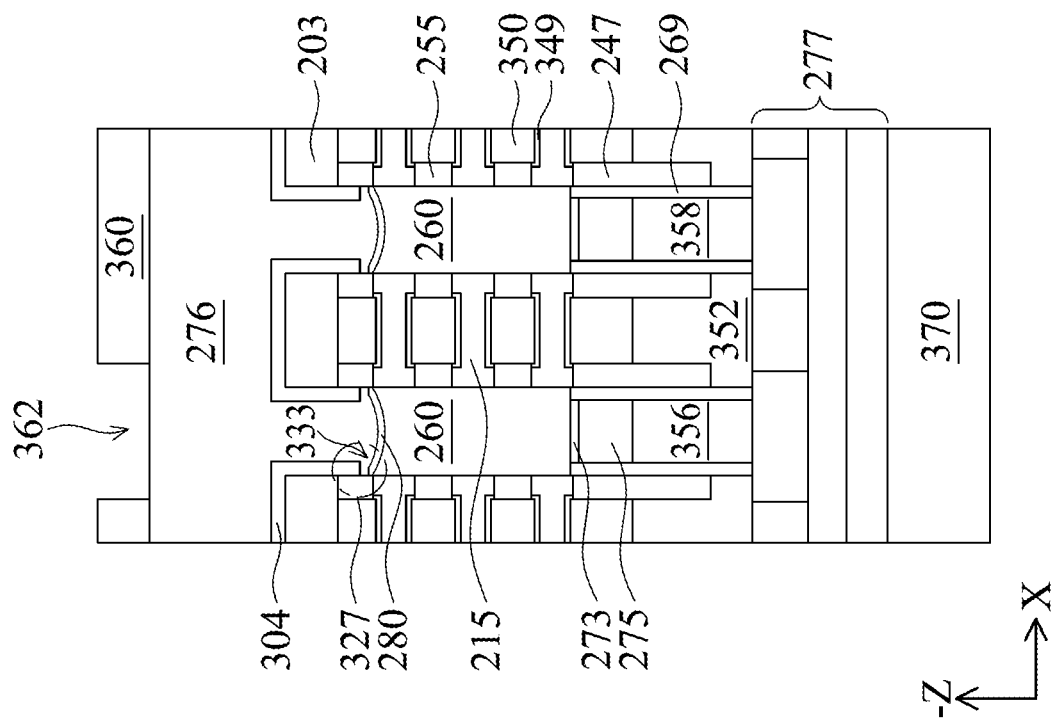
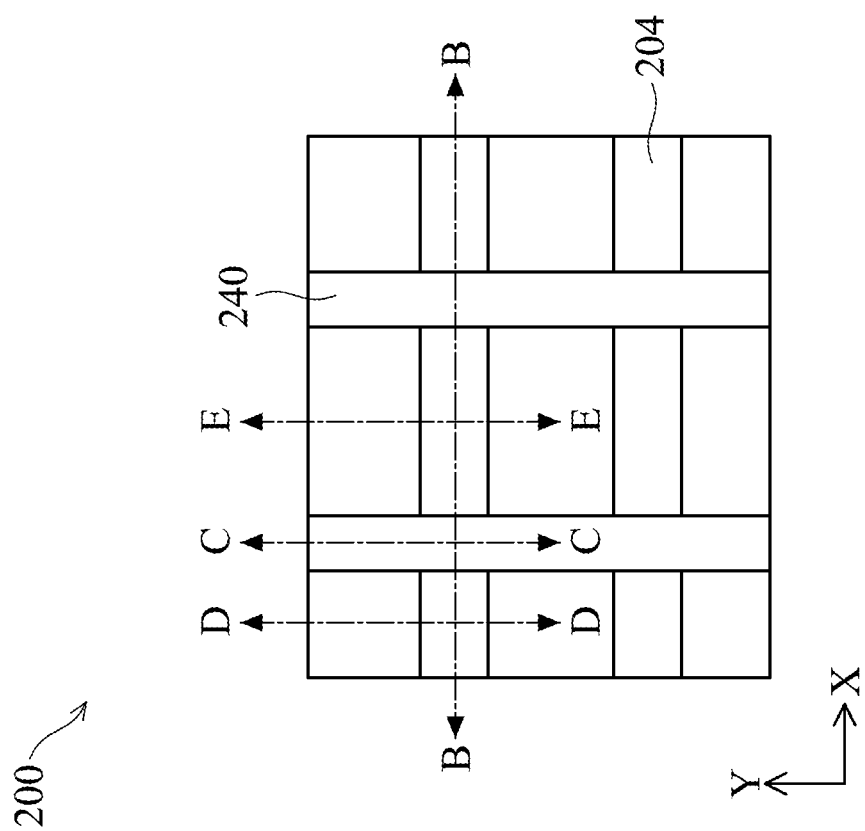
FIG. 10A
FIG. 10B

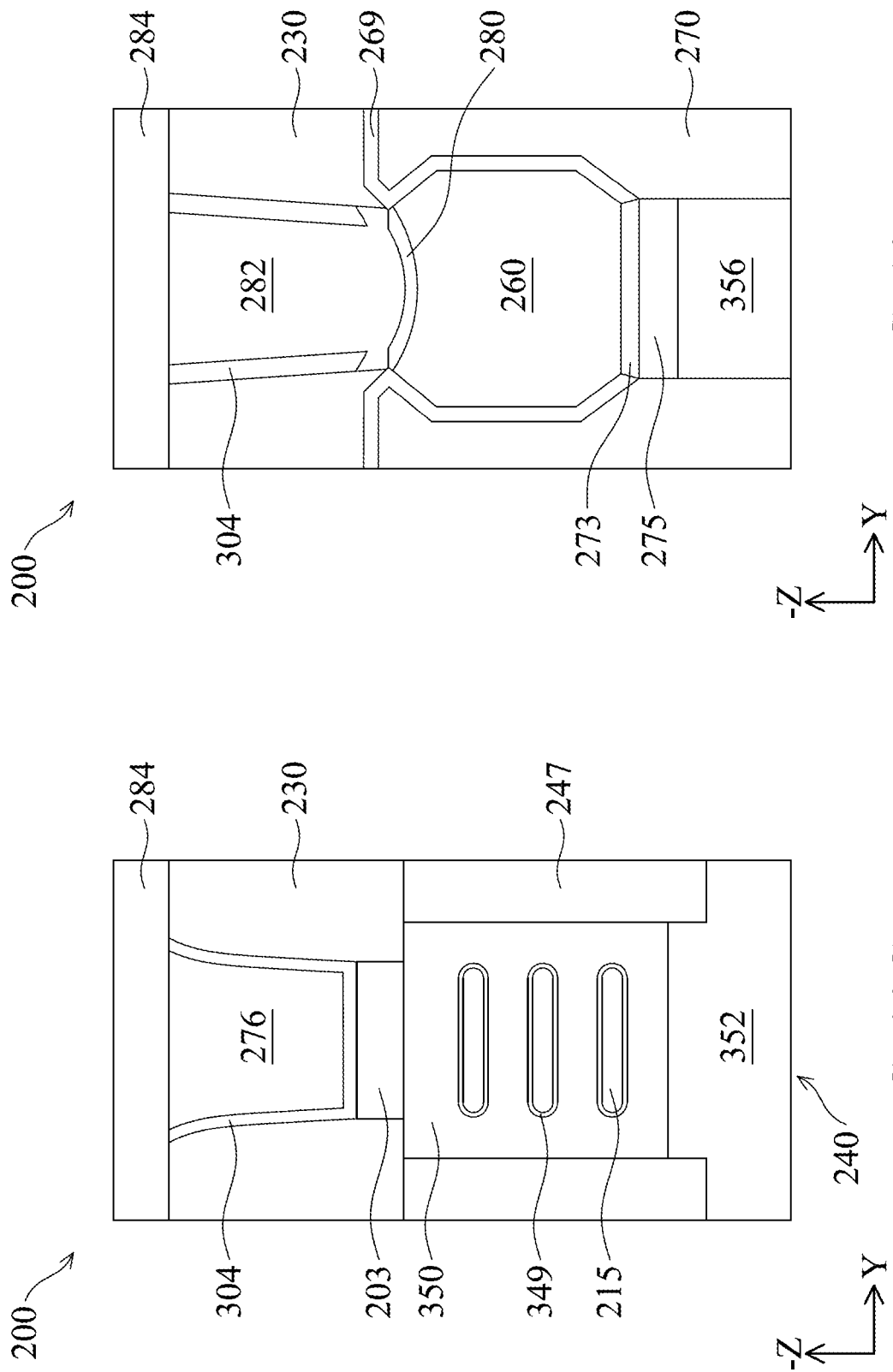

SELECTIVE LINER ON BACKSIDE VIA AND METHOD THEREOF

PRIORITY

This is a continuation of U.S. application Ser. No. 17/750,600, filed May 23, 2022, which is a divisional of U.S. application Ser. No. 16/944,263, filed Jul. 31, 2020, now U.S. Pat. No. 11,342,413, which claims benefits to U.S. Provisional App. Ser. No. 63/015,322 filed Apr. 24, 2020, the entire disclosures of which are incorporated herein by reference.

BACKGROUND

Conventionally, integrated circuits (IC) are built in a stacked-up fashion, having transistors at the lowest level and interconnect (vias and wires) on top of the transistors to provide connectivity to the transistors. Power rails (such as metal lines for voltage sources and ground planes) are also above the transistors and may be part of the interconnect. As the integrated circuits continue to scale down, so do the power rails. This inevitably leads to increased voltage drop across the power rails, as well as increased power consumption of the integrated circuits. Therefore, although existing approaches in semiconductor fabrication have been generally adequate for their intended purposes, they have not been entirely satisfactory in all respects. One area of interest is how to form power rails and vias on the backside of an IC with reduced resistance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 4A, 5A, 6A, 7A, 8A, 9A, 10A, 11A, 12A, and 13A illustrate top views of a portion of a semiconductor device, according to some embodiments.

FIGS. 2B, 3B, 4B, 5B, 6B, 7B, 8B, 9B, 10B, 11B, 12B, and 13B illustrate cross-sectional views of a portion of the semiconductor device along the B-B line in FIGS. 2A, 3A, 4A, 5A, 6A, 7A, 8A, 9A, 10A, 11A, 12A, and 13A, respectively, according to some embodiments.

FIGS. 2C, 4C, 5C, 6C, 7C, 8C, 9C, 10C, 11C, 12C, and 13C illustrate cross-sectional views of a portion of the semiconductor device along the C-C line in FIGS. 2A, 4A, 5A, 6A, 7A, 8A, 9A, 10A, 11A, 12A, and 13A, respectively, according to some embodiments.

FIGS. 2D, 4D, 5D, 6D, 7D, 8D, 9D, 10D, 11D, 12D, and 13D illustrate cross-sectional views of a portion of the semiconductor device along the D-D line in FIGS. 2A, 4A, 5A, 6A, 7A, 8A, 9A, 10A, 11A, 12A, and 13A, respectively, according to some embodiments.

DETAILED DESCRIPTION

Figure 1A:
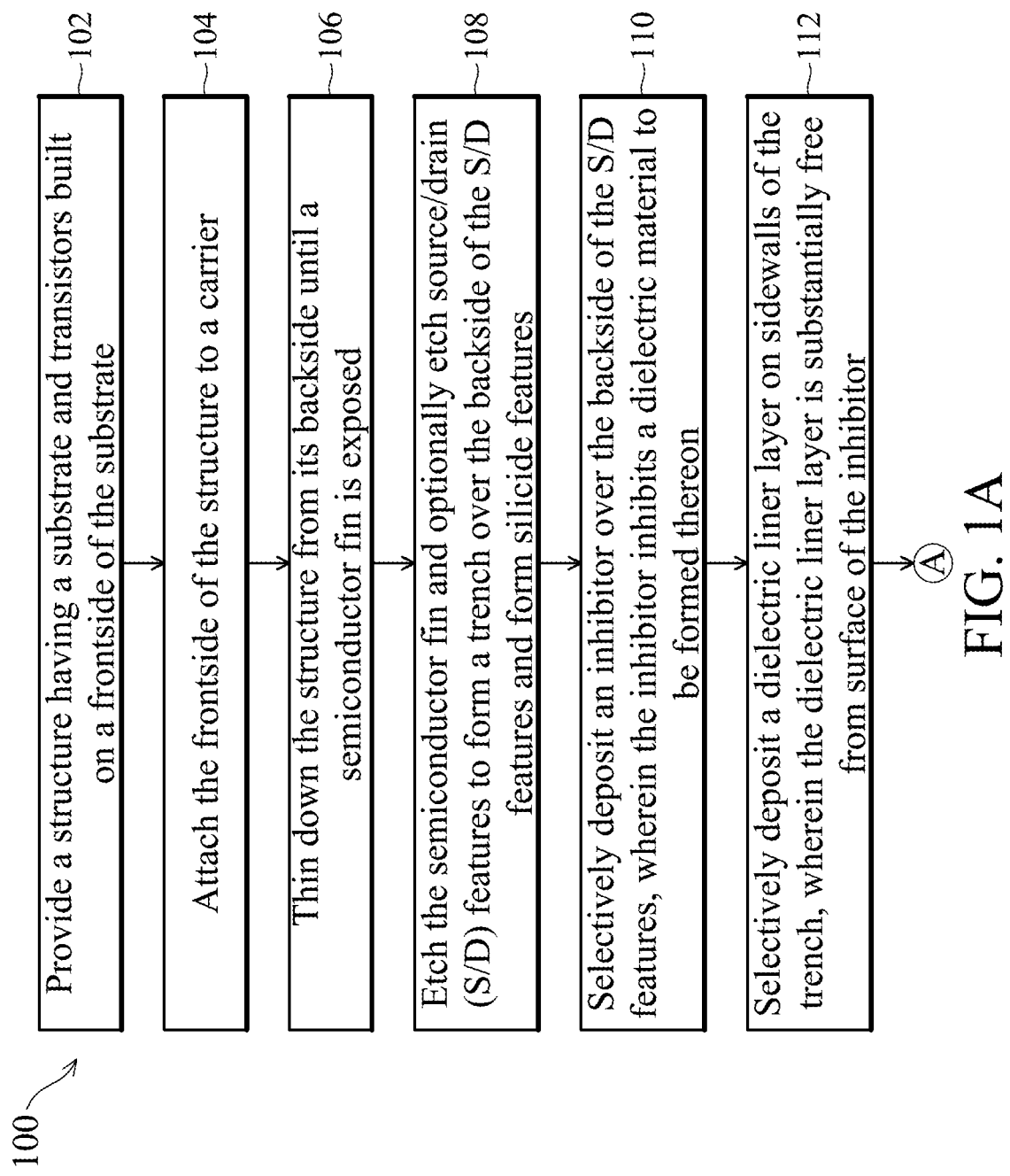
FIGS. 1A and 1B show a flow chart of a method of forming a semiconductor device with backside power rails and backside vias, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/− 10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to semiconductor devices with backside power rails and backside vias. As discussed above, power rails in IC need further improvement in order to provide the needed performance boost as well as reducing power consumption. An object of the present disclosure includes providing power rails (or power routings) on a back side (or backside) of a structure containing transistors (such as gate-all-around (GAA) transistors and/or FinFET transistors) in addition to an interconnect structure (which may include power rails as well) on a front side (or frontside) of the structure. This increases the number of metal tracks available in the structure for directly connecting to source/drain contacts and vias. It also increases the gate density for greater device integration than existing structures without the backside power rails. The backside power rails may have wider dimension than the first level metal (M0) tracks on the frontside of the structure, which beneficially reduces the power rail resistance. The present disclosure also provides a backside via structure for connecting the backside power rails to S/D features on the frontside. The backside via structure has a liner layer that is deposited on sidewalls of a backside via hole but not on the bottom surface of the backside via hole. This eliminates the step of breaking through the liner layer when depositing conductor into the backside via hole, thereby preventing damages to the backside of the source/drain features. It also increases the area of the source/drain features for silicidation and generally increases the source/drain contact area, thereby reducing source/drain contact resistance from the backside of the wafer. The details of the structure and fabrication methods of the present disclosure are described below in conjunction with the accompanied drawings, which illustrate a process of making a GAA device, according to some embodiments. A GAA device refers to a device having vertically-stacked horizontally-oriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. For the purposes of simplicity, the present disclosure uses GAA devices as an example. Those of ordinary skill in the art should appreciate that they may readily use the present disclosure as a basis for designing or modifying other processes and structures (such as FinFET devices) for carrying out the same purposes and/or achieving the same advantages of the embodiments introduced herein.

Figure 1B:
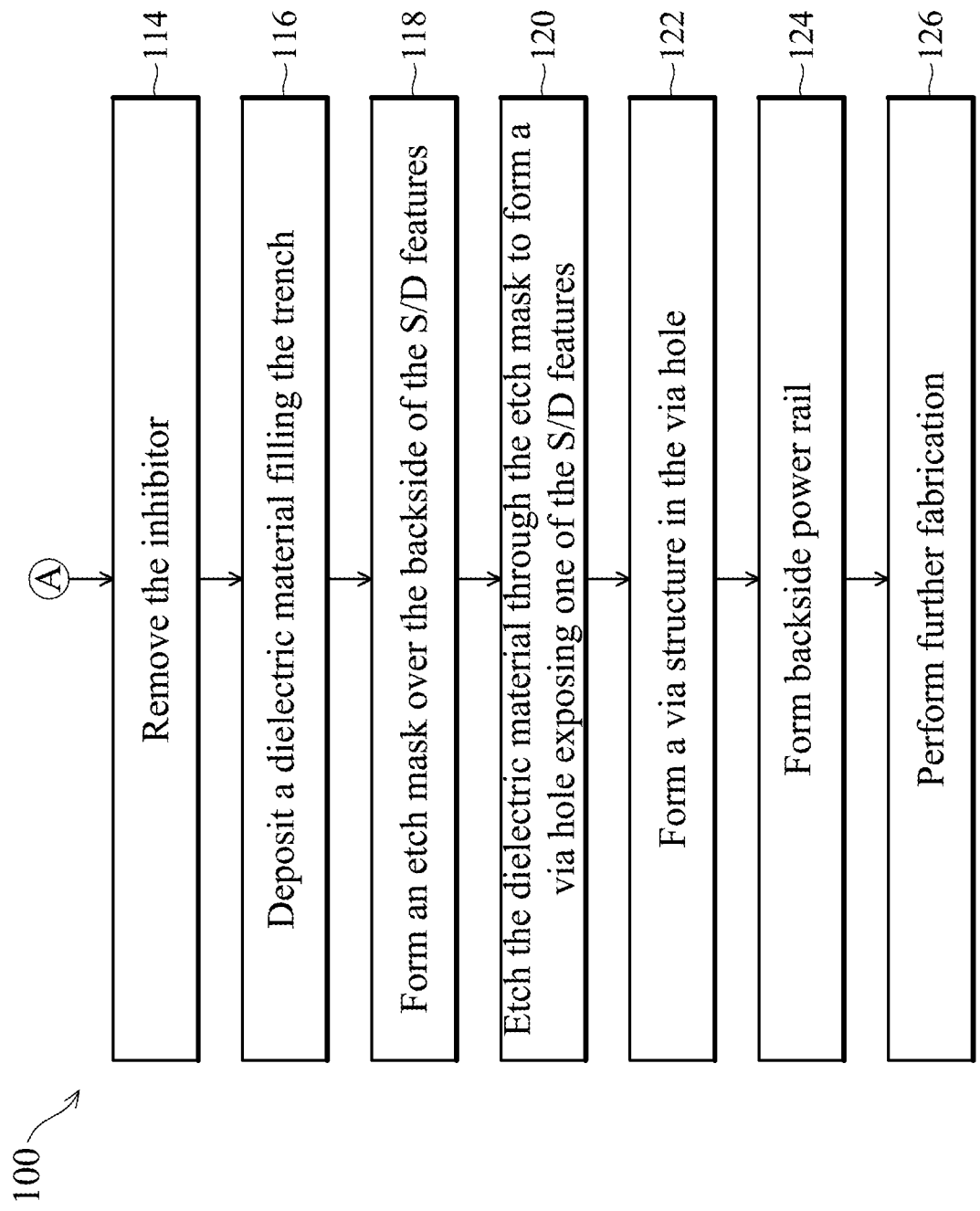

FIGS. 1A and 1B are a flow chart of a method 100 for fabricating a semiconductor device according to various aspects of the present disclosure. Additional processing is contemplated by the present disclosure. Additional operations can be provided before, during, and after method 100, and some of the operations described can be moved, replaced, or eliminated for additional embodiments of method 100.

Method 100 is described below in conjunction with FIG. 2A through FIG. 13E that illustrate various top and cross-sectional views of a semiconductor device (or a semiconductor structure) 200 at various steps of fabrication according to the method 100, in accordance with some embodiments. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2A through 13E have been simplified for the sake of clarity to better understand the inventive concepts of the present disclosure. Additional features can be added in the device 200, and some of the features described below can be replaced, modified, or eliminated in other embodiments of the device 200.

Figures 2A, 2B:
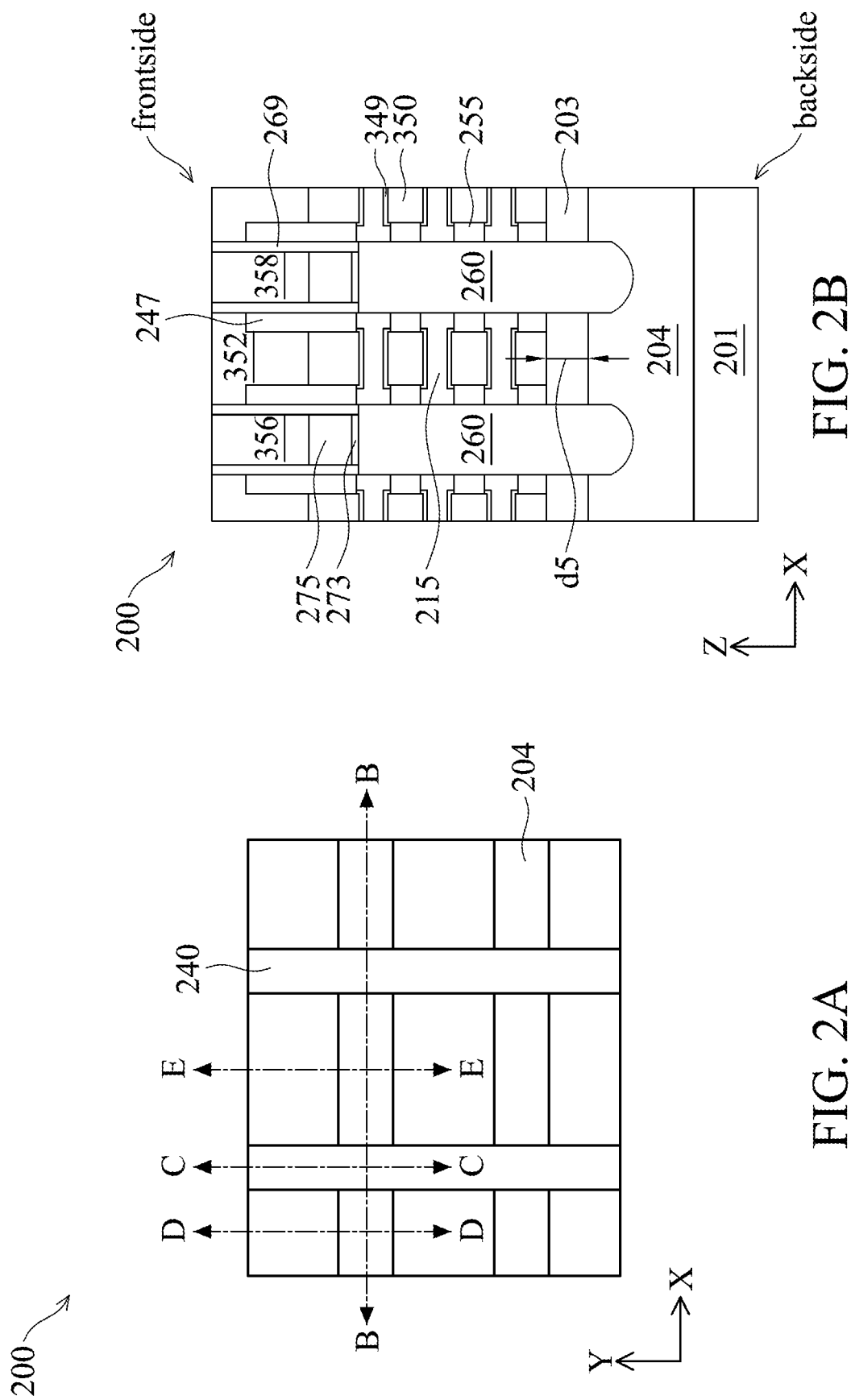
Figure 2E:
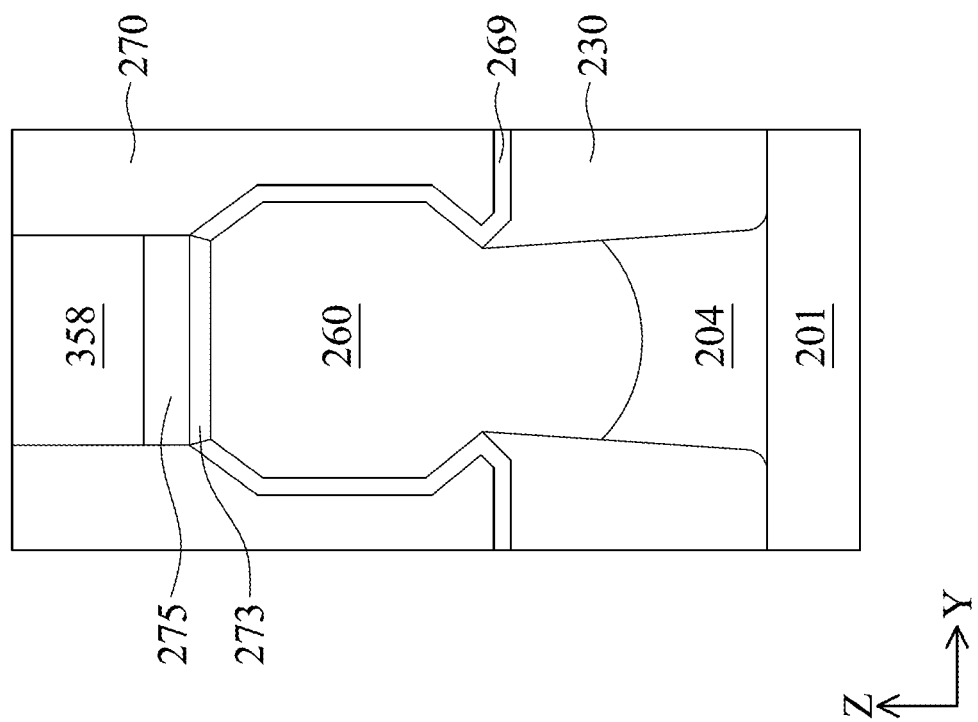
FIGS. 2E, 4E, 5E, 6E, 7E, 8E, 9E, 10E, 11E, 12E, and 13E illustrate cross-sectional views of a portion of the semiconductor device along the E-E line in FIGS. 2A, 4A, 5A, 6A, 7A, 8A, 9A, 10A, 11A, 12A, and 13A, respectively, according to some embodiments.

At operation 102, the method 100 (FIG. 1A) provides semiconductor device 200 having a substrate 201 and transistors built on a frontside of the substrate 201. FIG. 2A illustrates a top view of the device 200, and FIGS. 2B, 2C, 2D, and 2E illustrate cross-sectional views of the device 200, in portion, along the B-B line, the C-C line, the D-D line, and the E-E line in FIG. 2A, respectively. Particularly, the B-B line is cut along the lengthwise direction of a semiconductor fin 204 (direction "X"), the C-C line is cut along the lengthwise direction of a gate stack 240 (direction "Y"), the D-D line is cut into the source regions of the transistors and is parallel to the gate stacks 240, and the E-E line is cut into the drain regions of the transistors and is parallel to the gate stacks 240. The B-B lines, C-C lines, D-D lines, and E-E lines in FIGS. 3A through 13A are similarly configured.

Referring to FIGS. 2A-2E, the semiconductor device 200 includes the substrate 201 at its backside and various elements built on the front surface of the substrate 201. These elements include an isolation structure 230 over the substrate 201, a semiconductor fin 204 extending from the substrate 201 and adjacent to the isolation structure 230, two epitaxial source/drain (S/D) features 260 over the semiconductor fin 204, one or more channel semiconductor layers 215 suspended over the semiconductor fin 204 and connecting the two S/D features 260, a gate stack 240 between the two S/D features 260 and wrapping around each of the channel layers 215, and a bottom self-aligned capping (B-SAC) layer 203 disposed between the semiconductor fin 204 and both the channel layers 215 and the gate stack 240. The semiconductor device 200 further includes inner spacers 255 between the S/D features 260 and the gate stack 240, a (outer) gate spacer 247 over sidewalls of the gate stack 240 and over the topmost channel layer 215, a contact etch stop layer (CESL) 269 adjacent to the gate spacer 247 and over the epitaxial S/D features 260 and the isolation structure 230, an inter-layer dielectric (ILD) layer 270 over the CESL 269. Over the gate stack 240, the semiconductor device 200 further includes a self-aligned capping layer 352. Over the S/D features 260, the semiconductor device 200 further includes silicide features 273, S/D contacts 275, dielectric S/D capping layer 356, and S/D contact via 358. In the depicted embodiment, the S/D capping layer 356 is disposed over the source feature 260, and the S/D contact via 358 is disposed over the drain feature 260. In alternative embodiments, the S/D capping layer 356 may be disposed over the drain feature 260, and the S/D contact via 358 may be disposed over the source feature 260. In some embodiments, the S/D capping layer 356 may be disposed over both the source and the drain features 260. In some embodiments the S/D contact vias 358 may be disposed over both the source and the drain features 260.

Figure 3B:
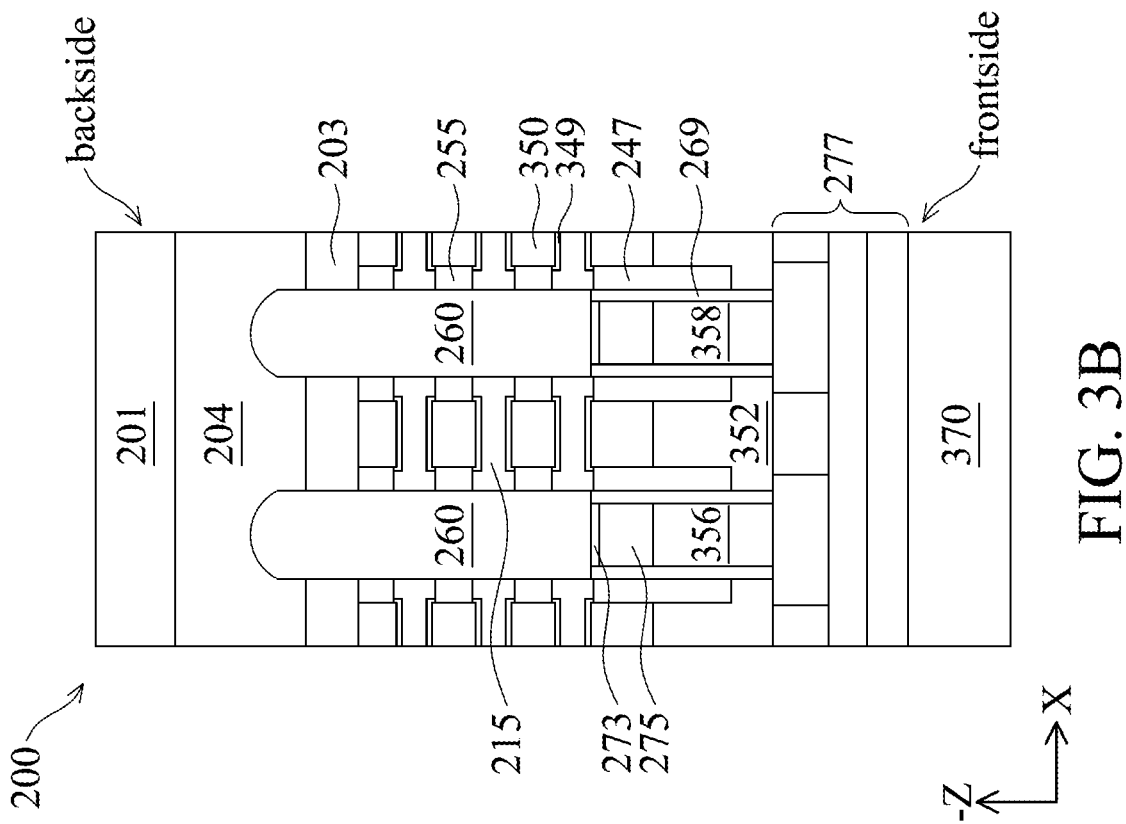
Figure 3A:
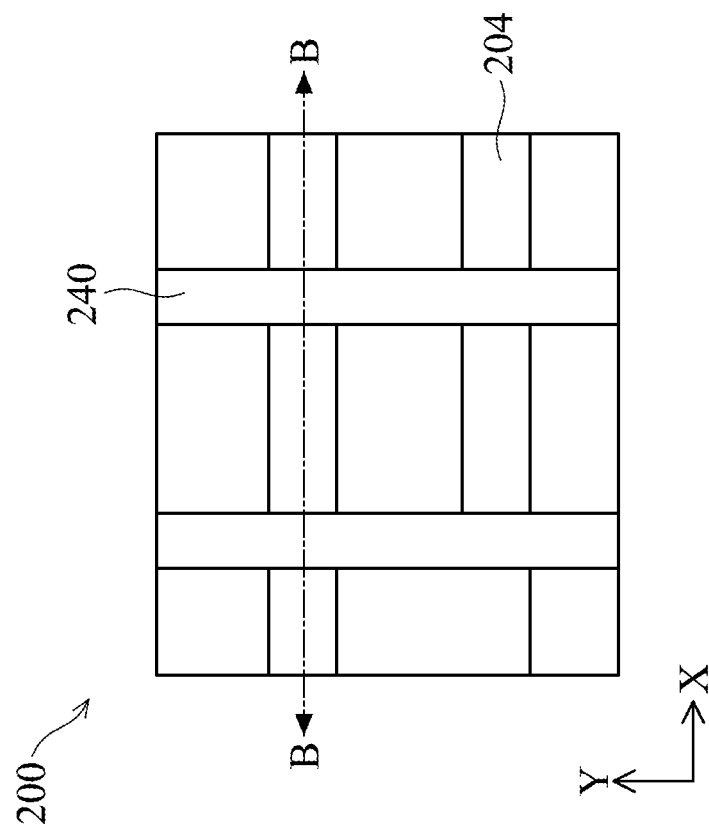
Figure 4E:
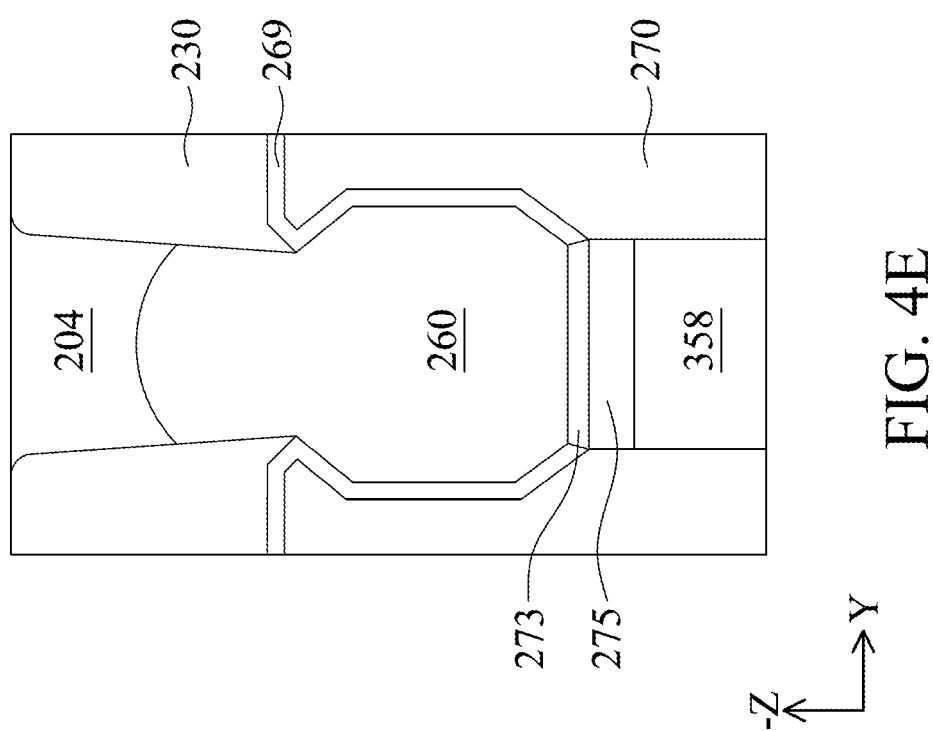
Figure 5A:
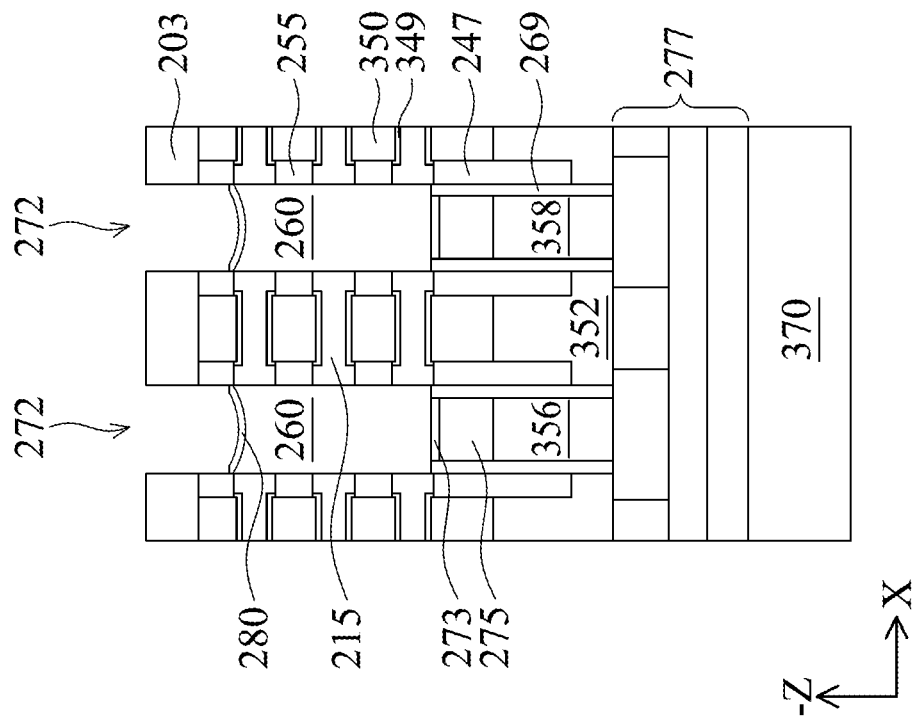
Figure 5B:
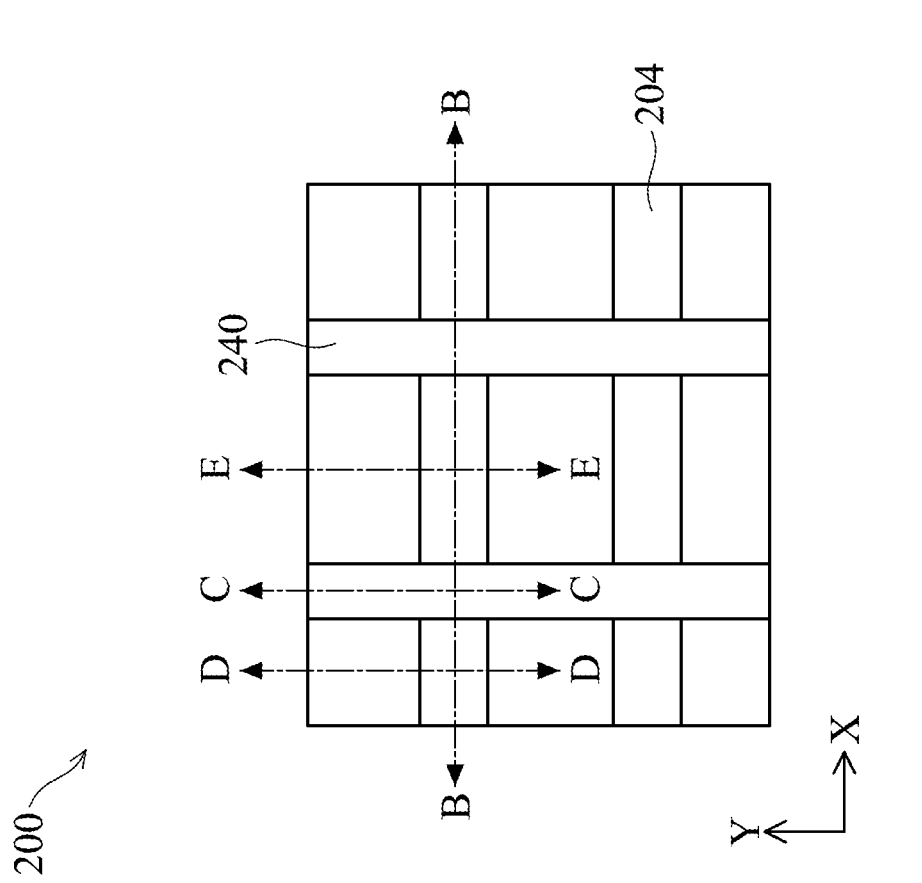
Figure 5D:
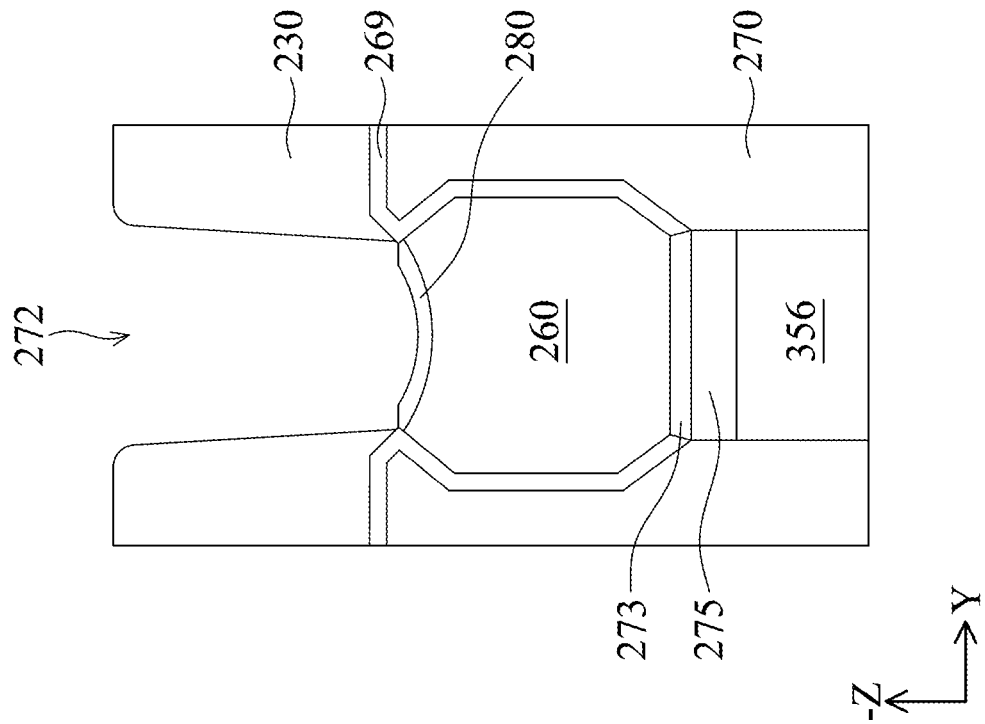
Figure 5C:
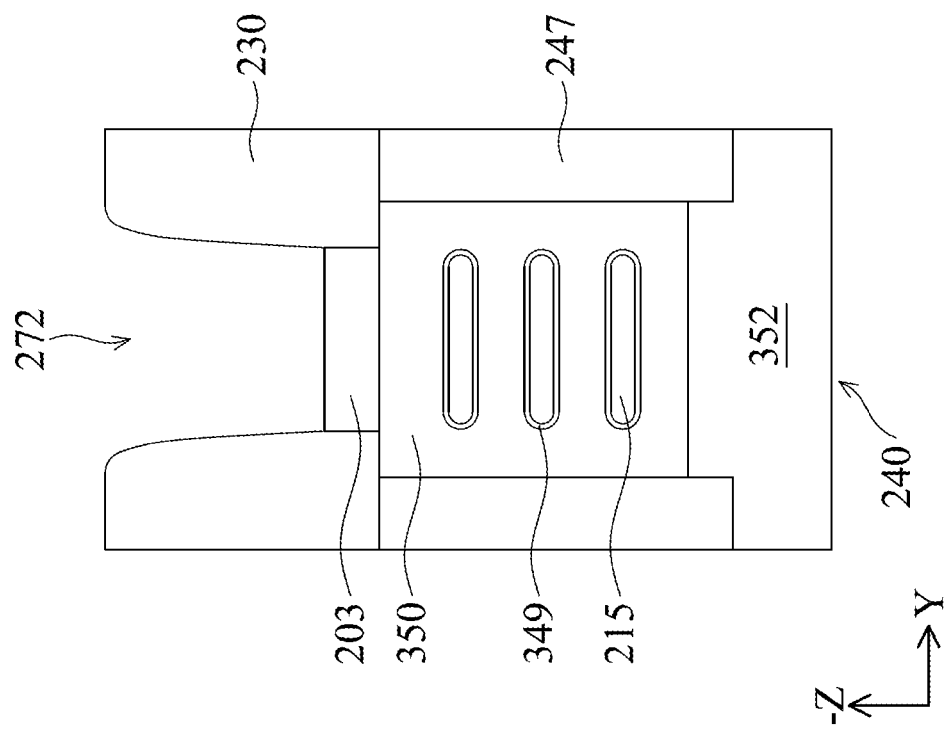
Figure 5E:
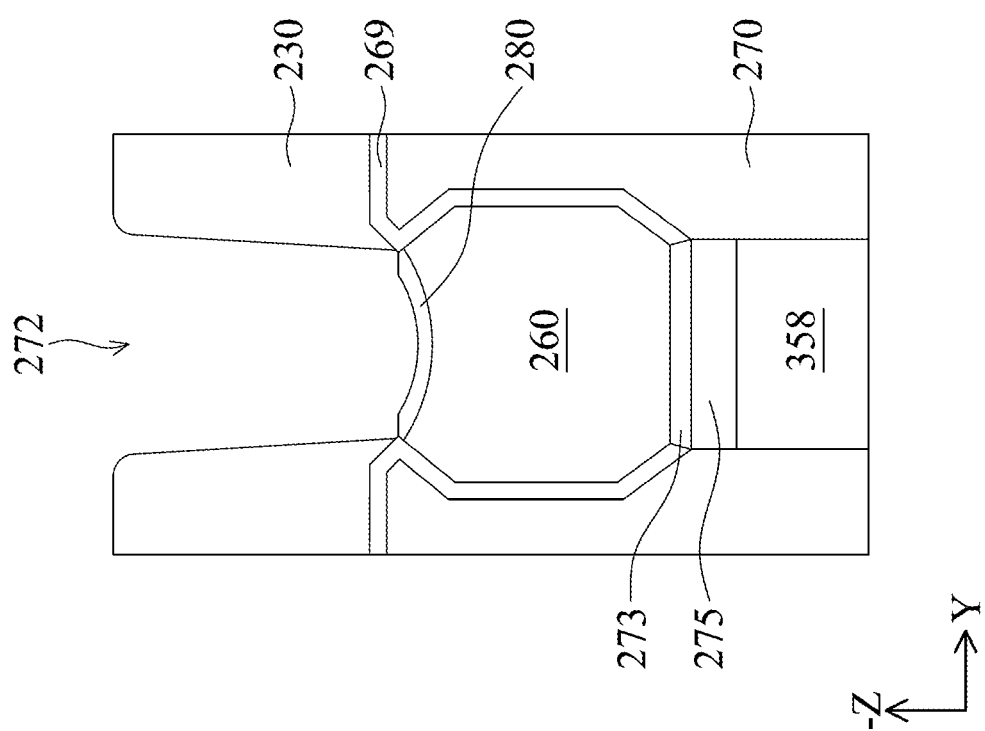
Figure 6D:
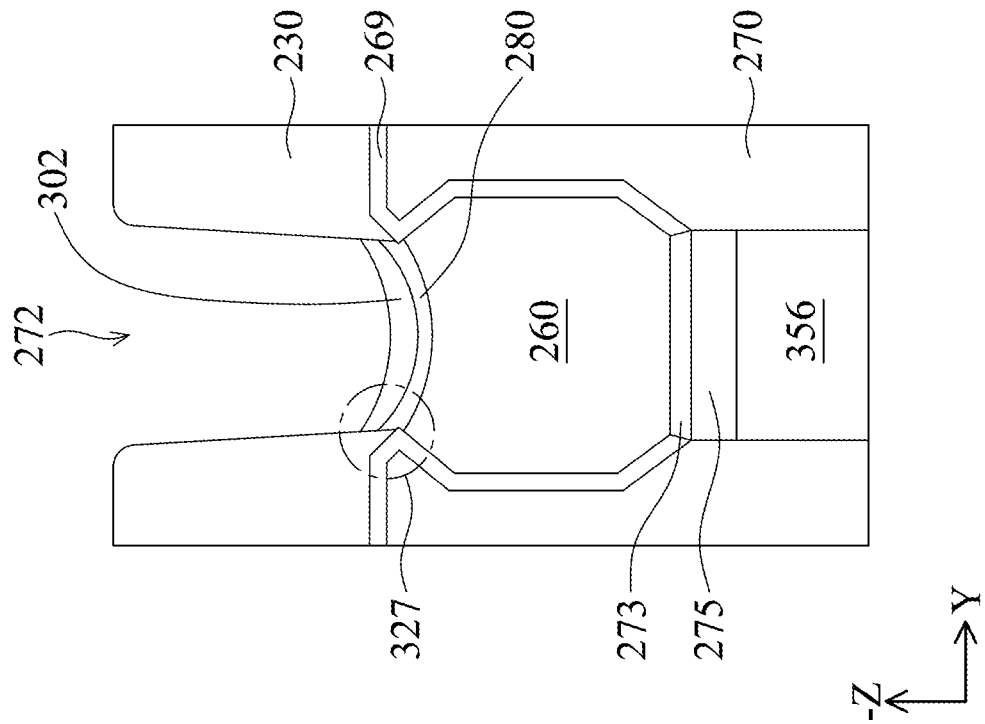
Figure 6C:
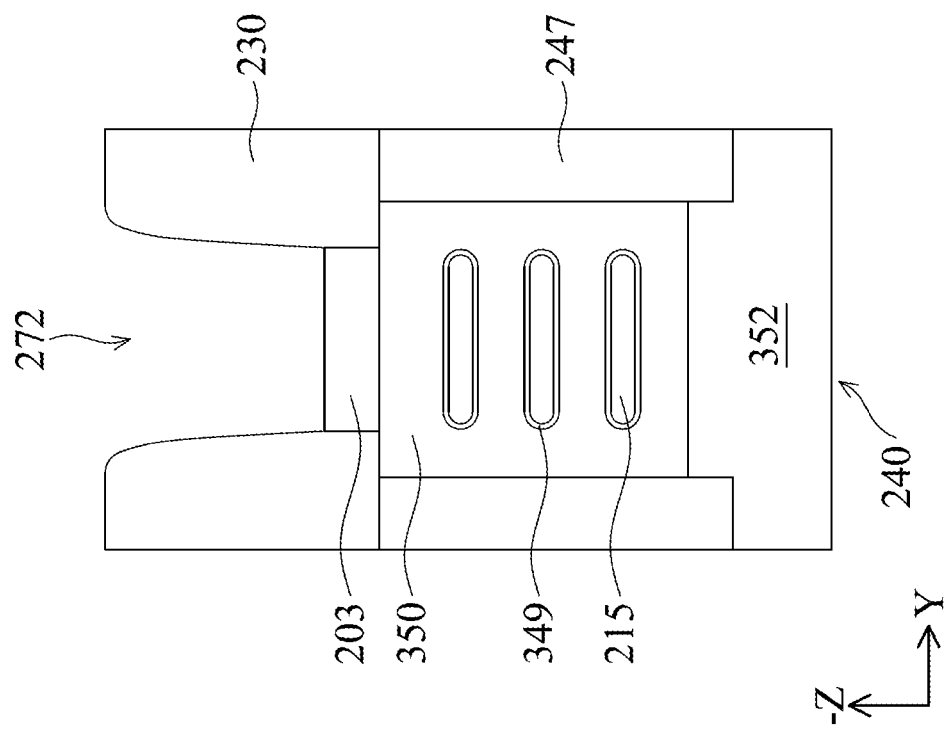
Figure 6E:
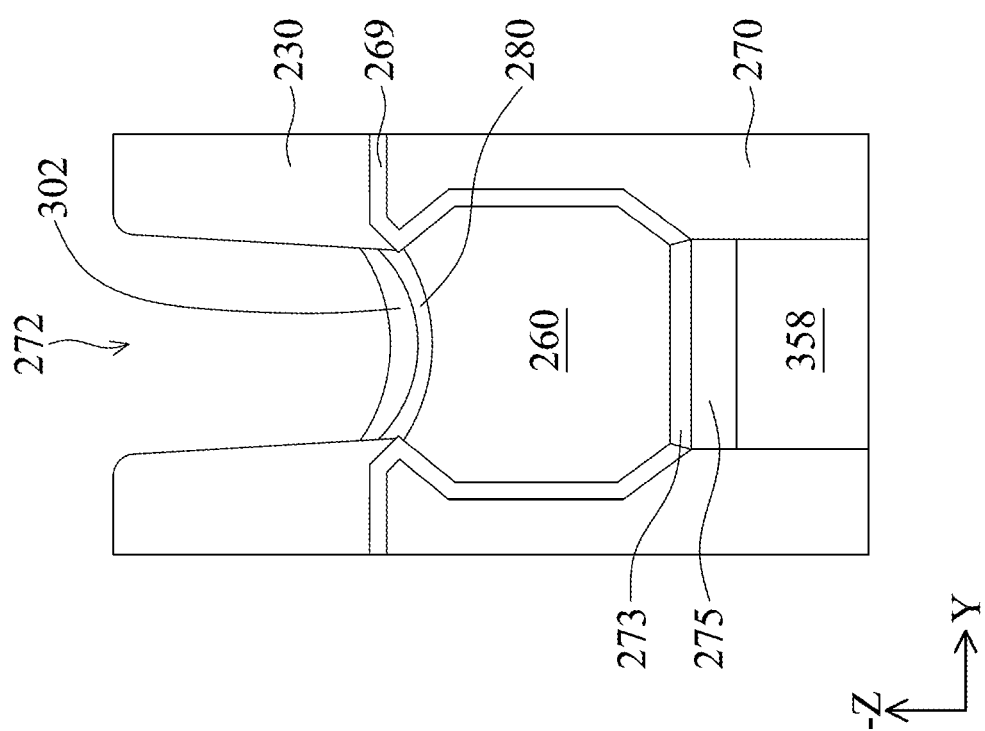
Figure 7D:
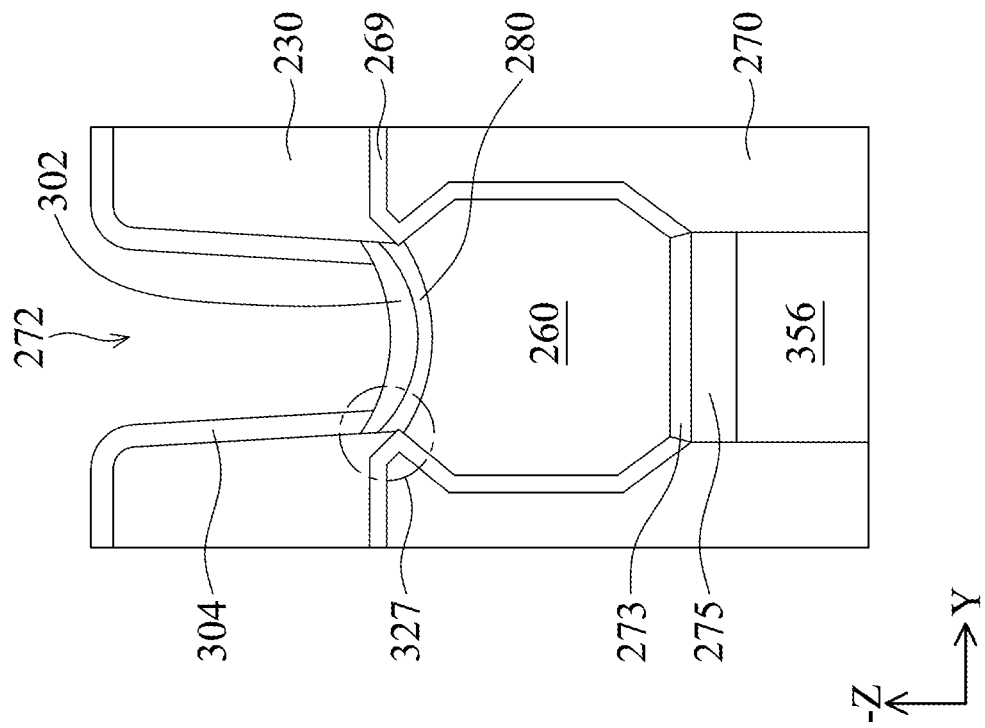
Figure 7C:
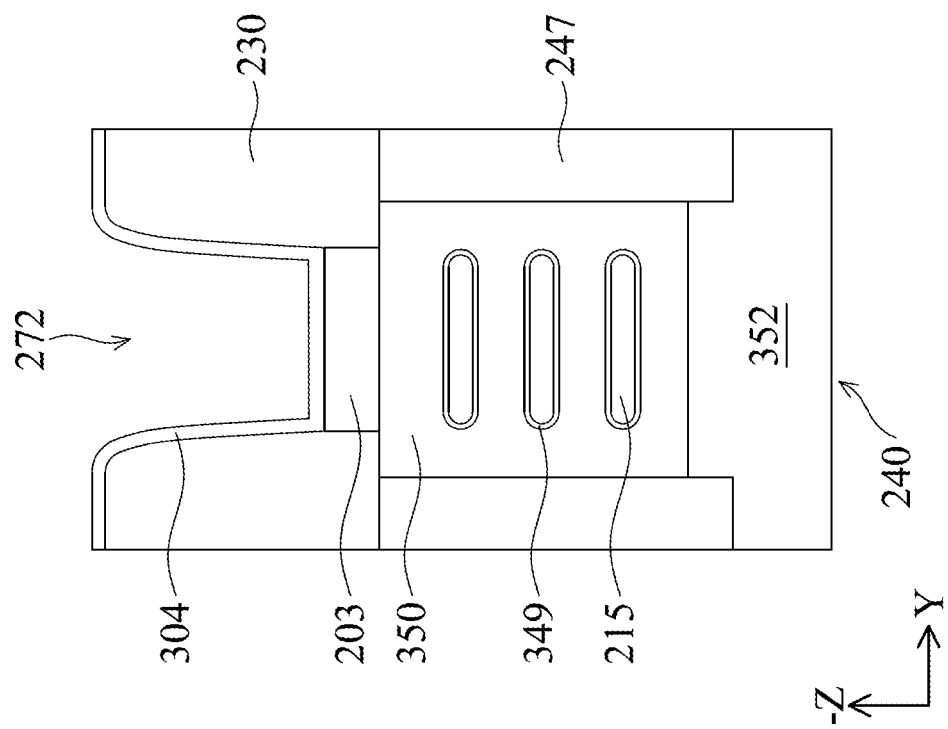
Figure 7E:
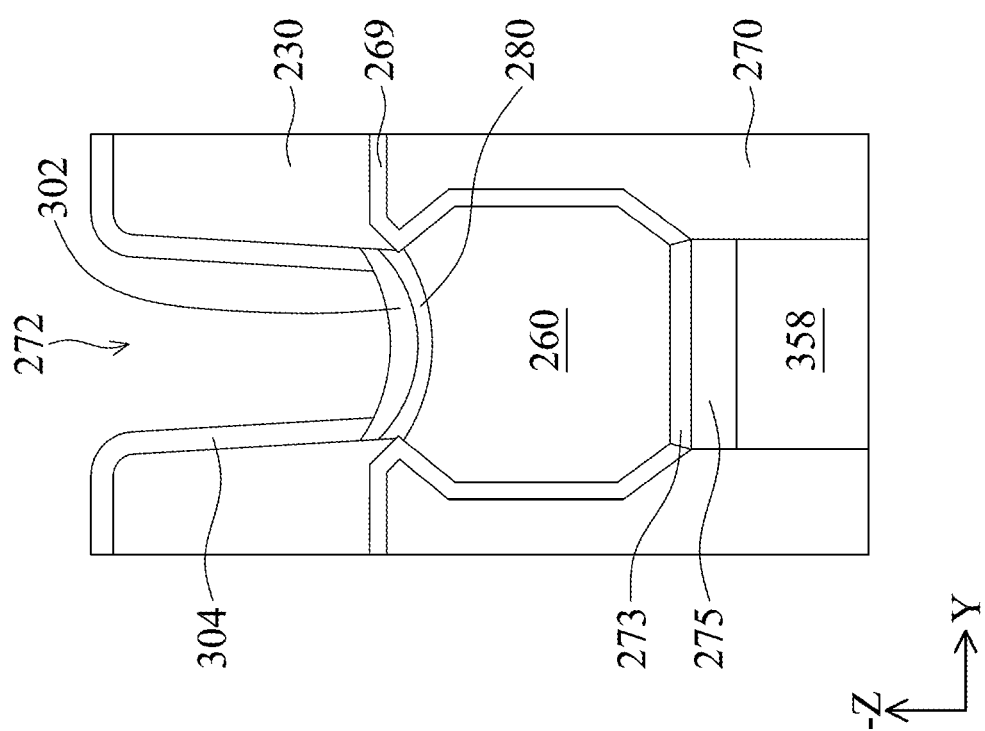
Figure 8A:
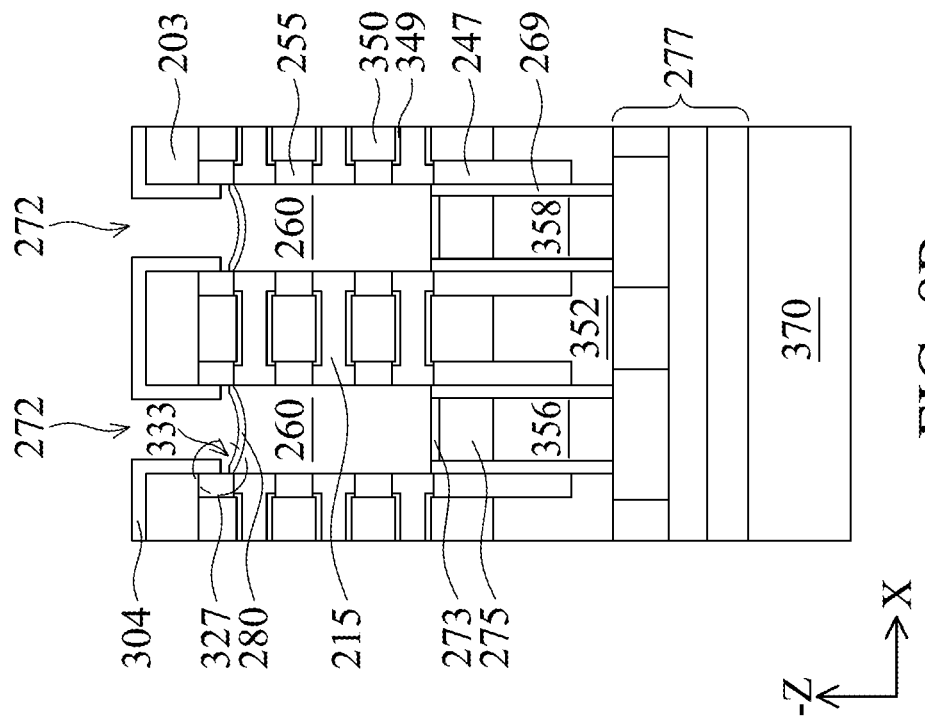
Figure 8B:
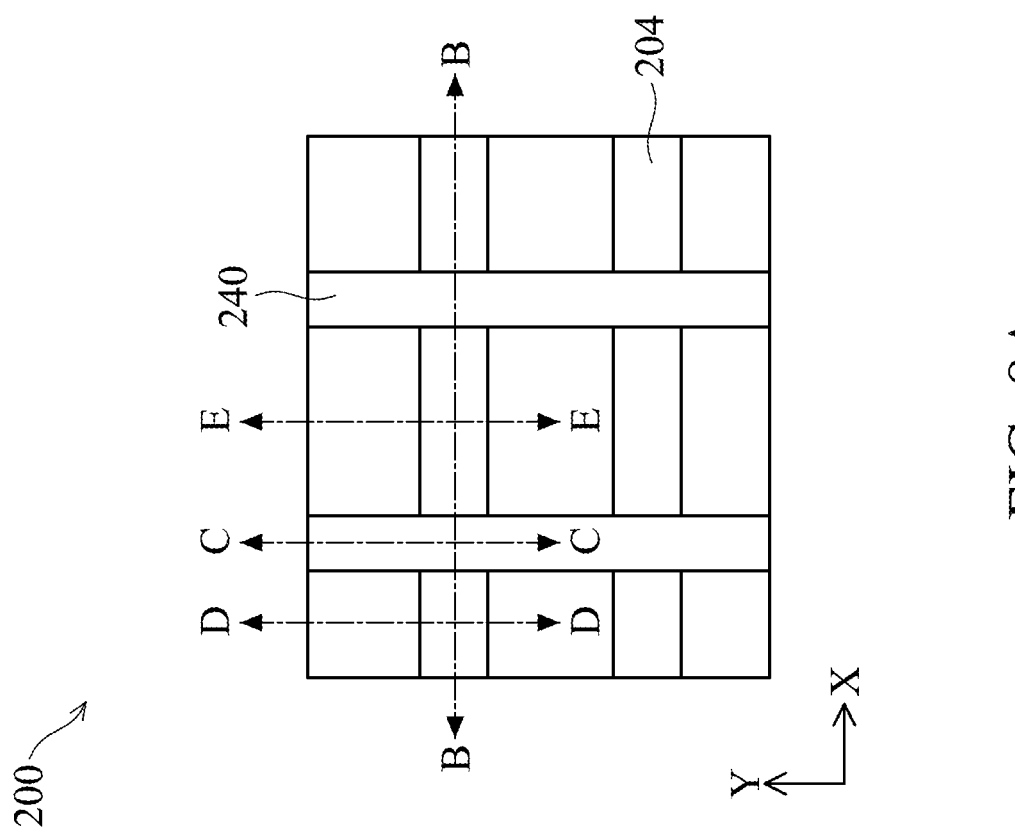
Figures 8C, 8D:
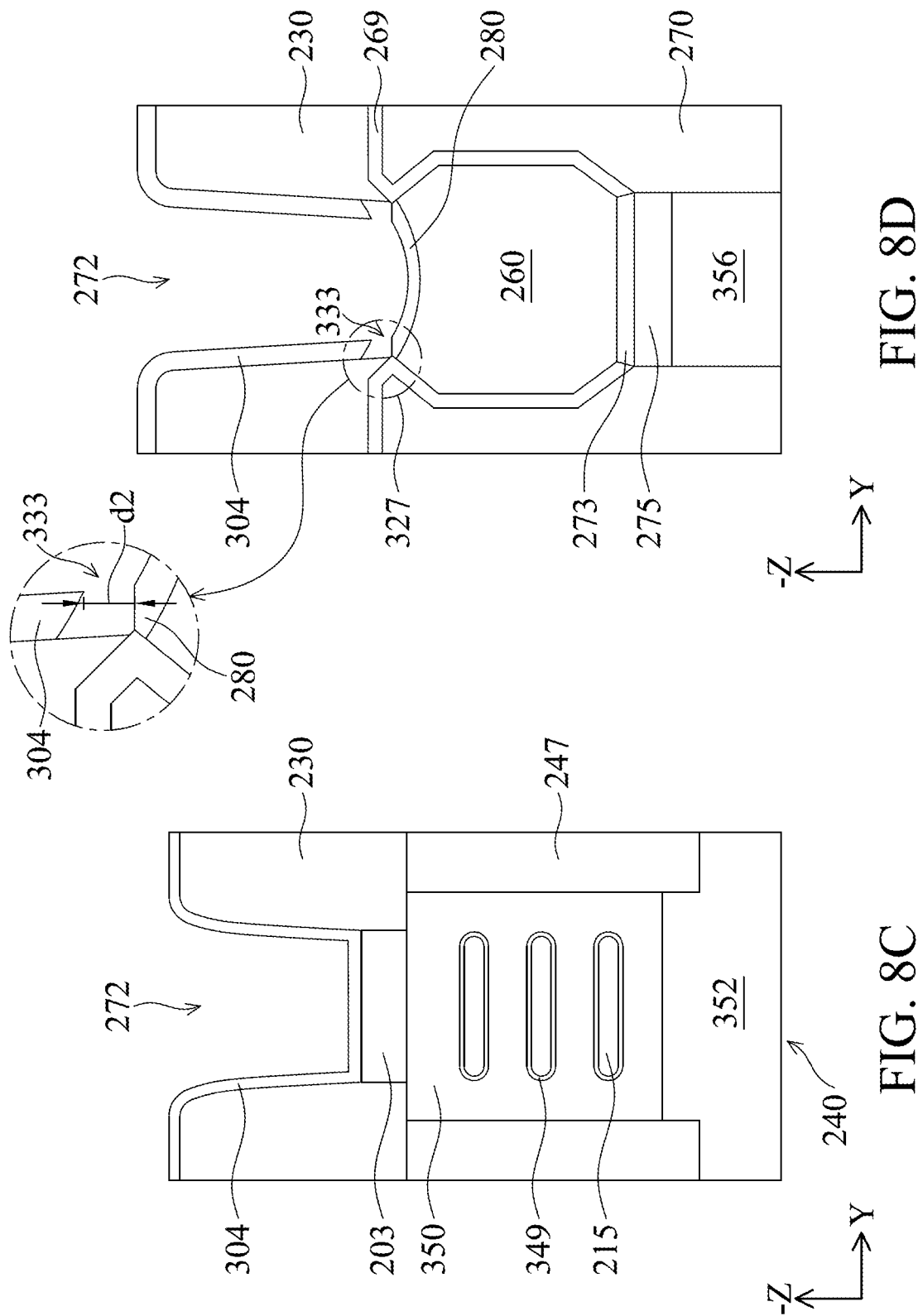
Figure 8E:
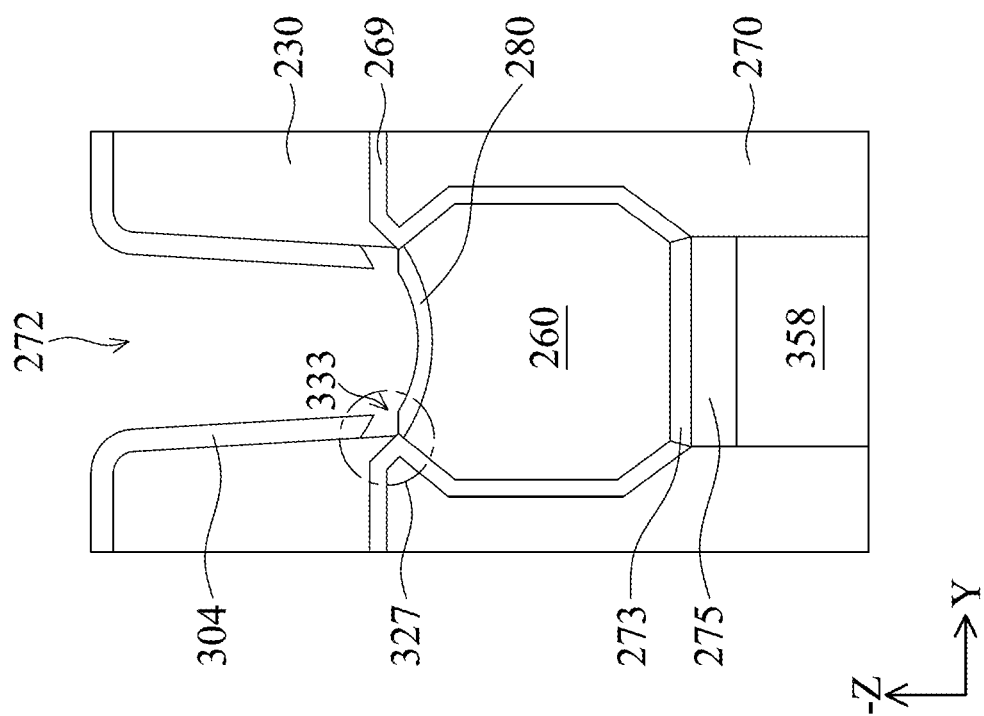
Figure 9D:
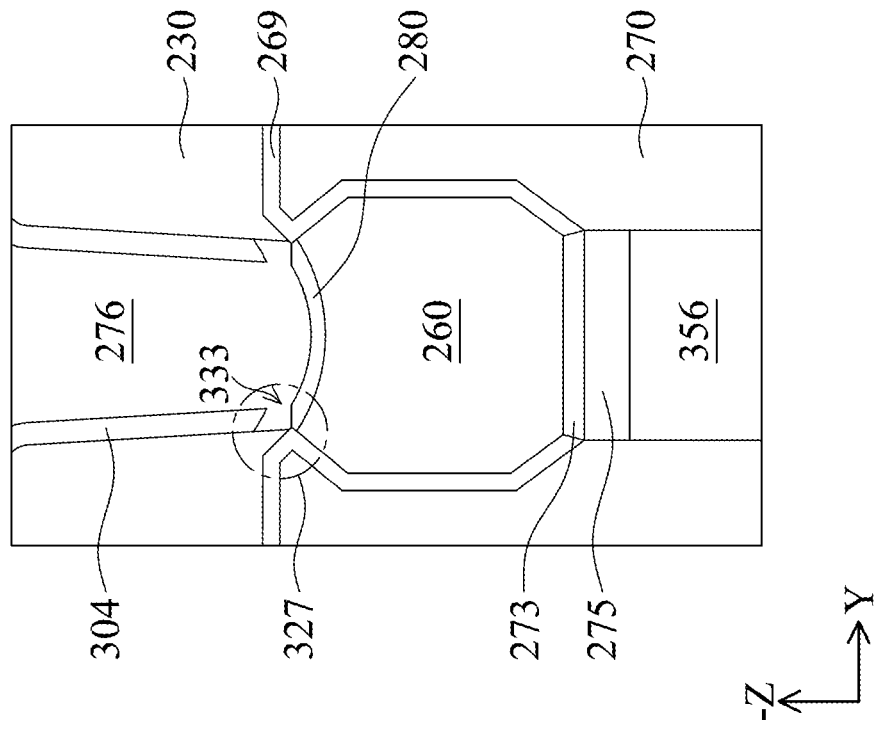
Figure 9C:
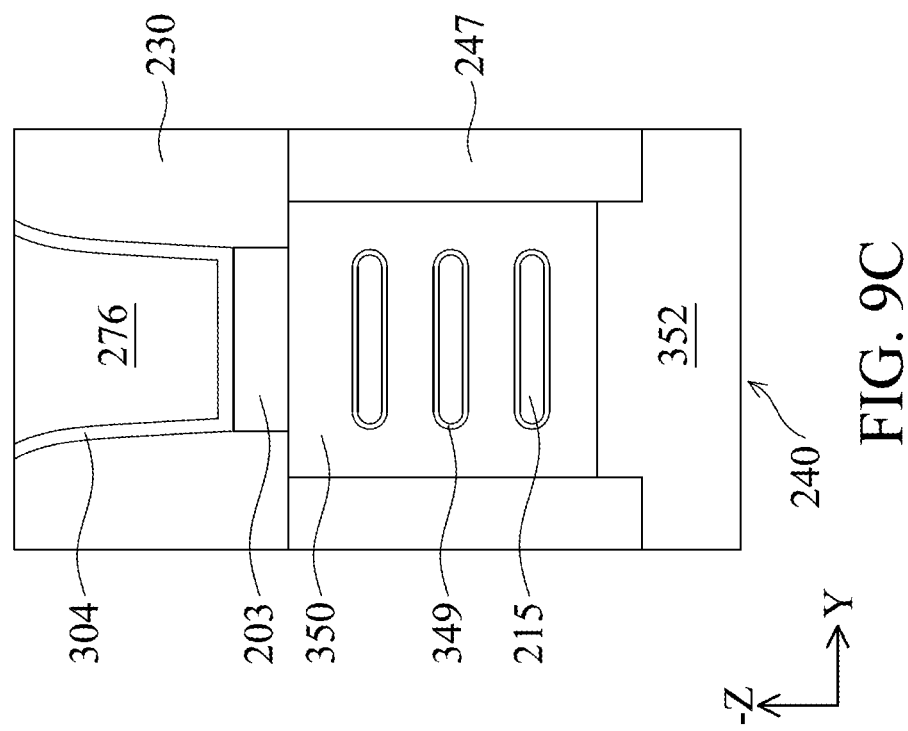
Figure 9E:
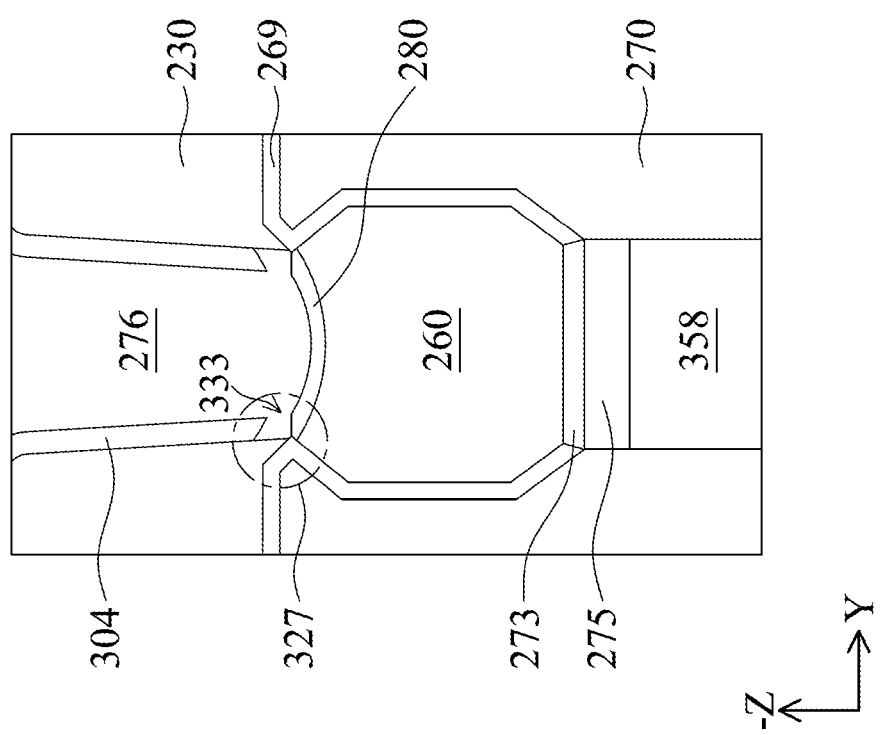
Figure 10D:
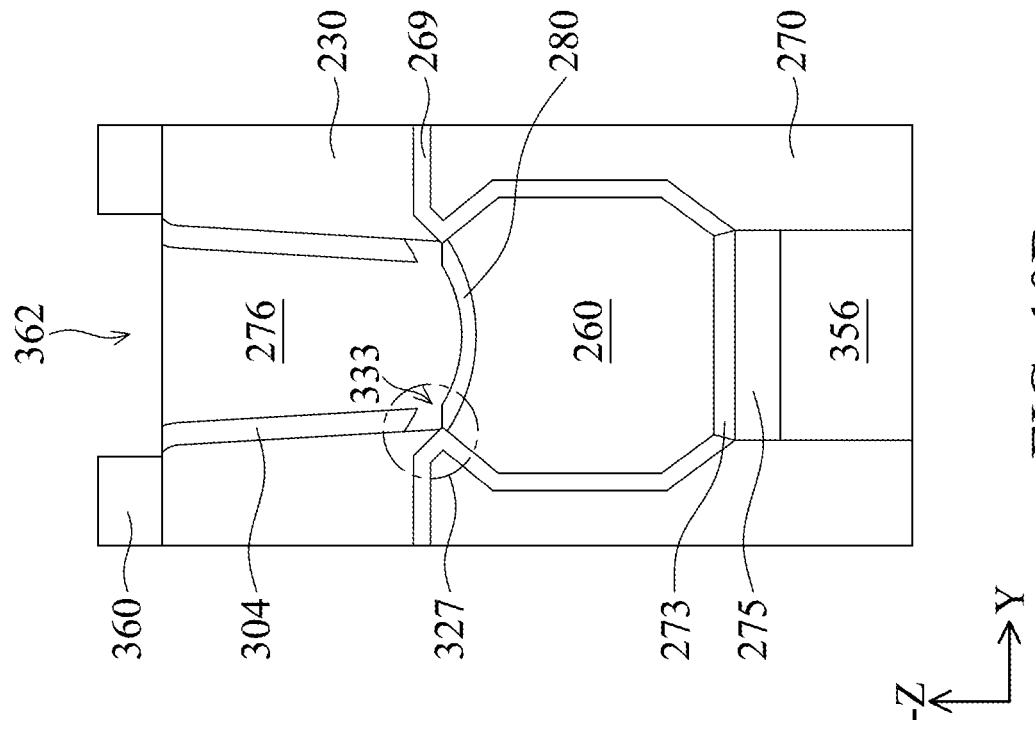
Figure 10C:
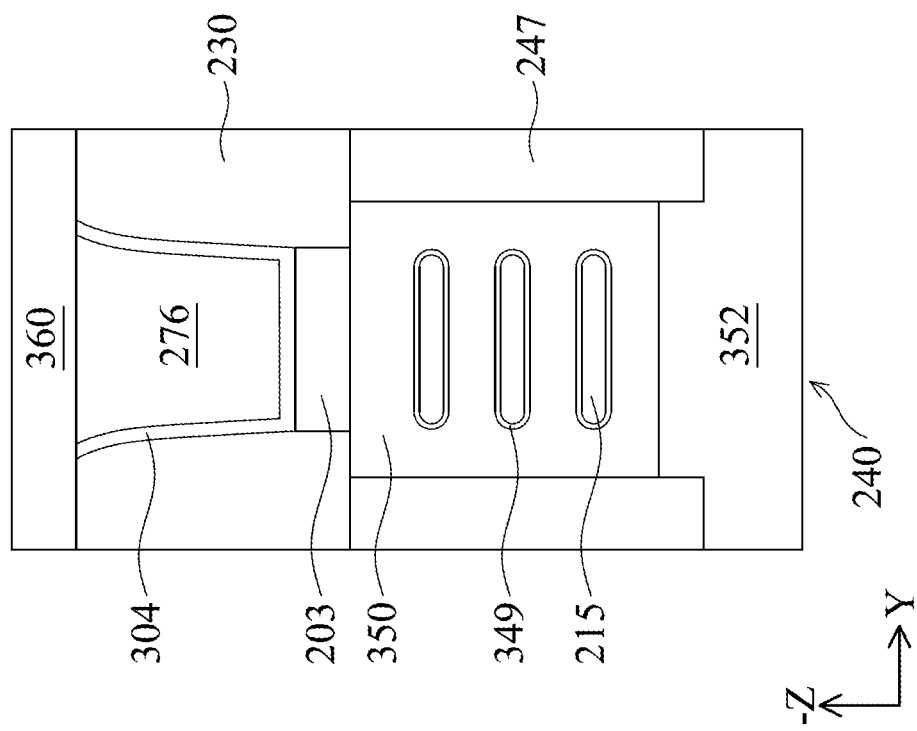
Figure 10E:
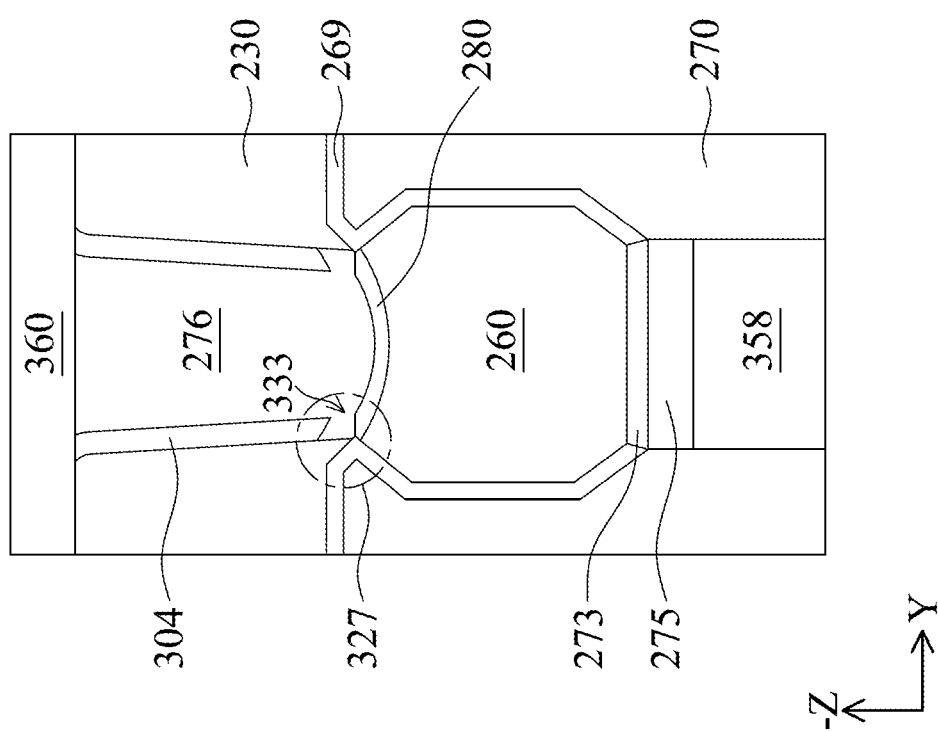
Figure 11B:
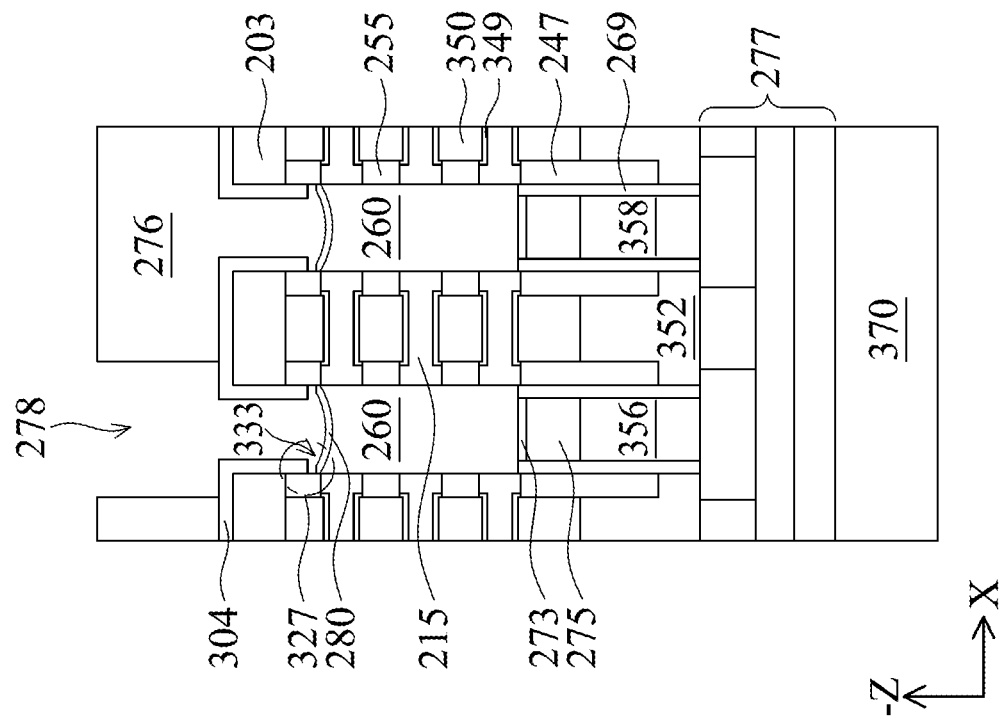
Figure 11A:
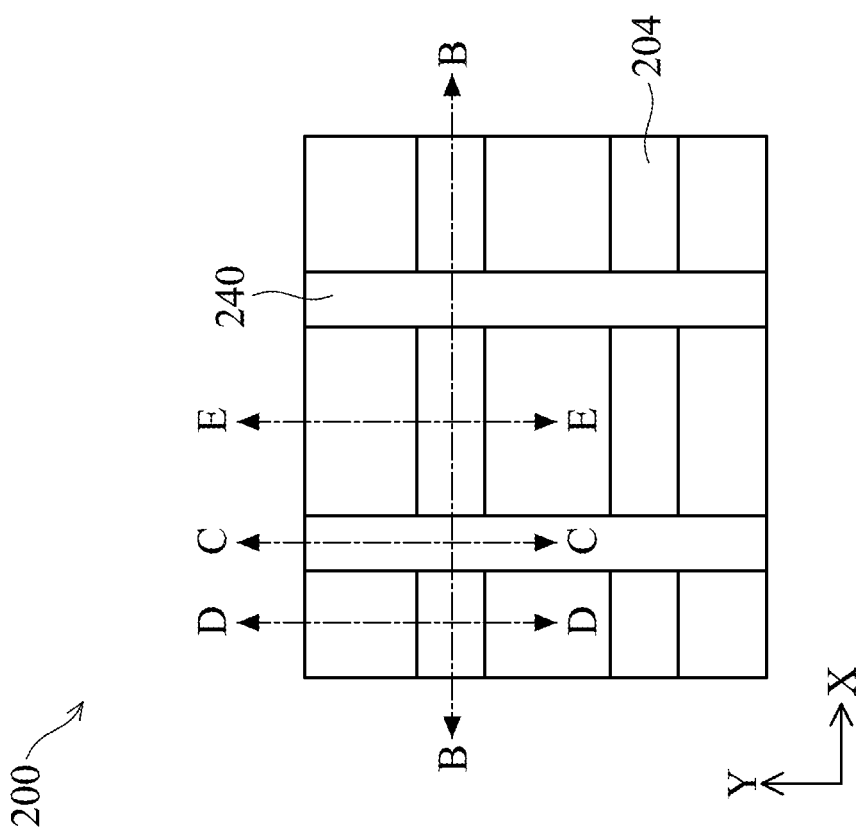
Figure 11D:
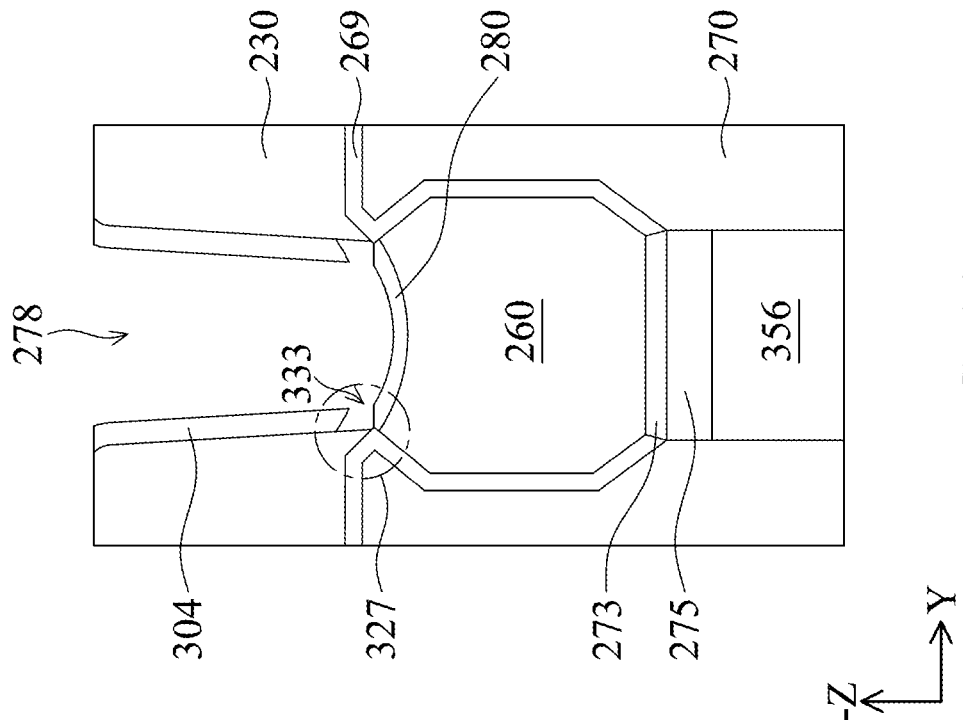
Figure 11C:
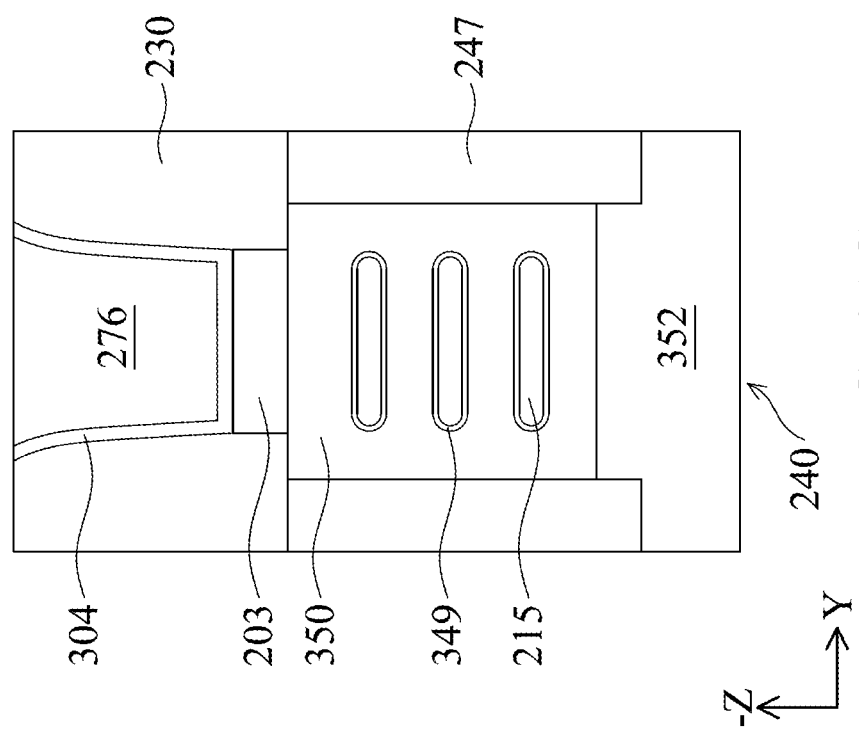
Figure 11E:
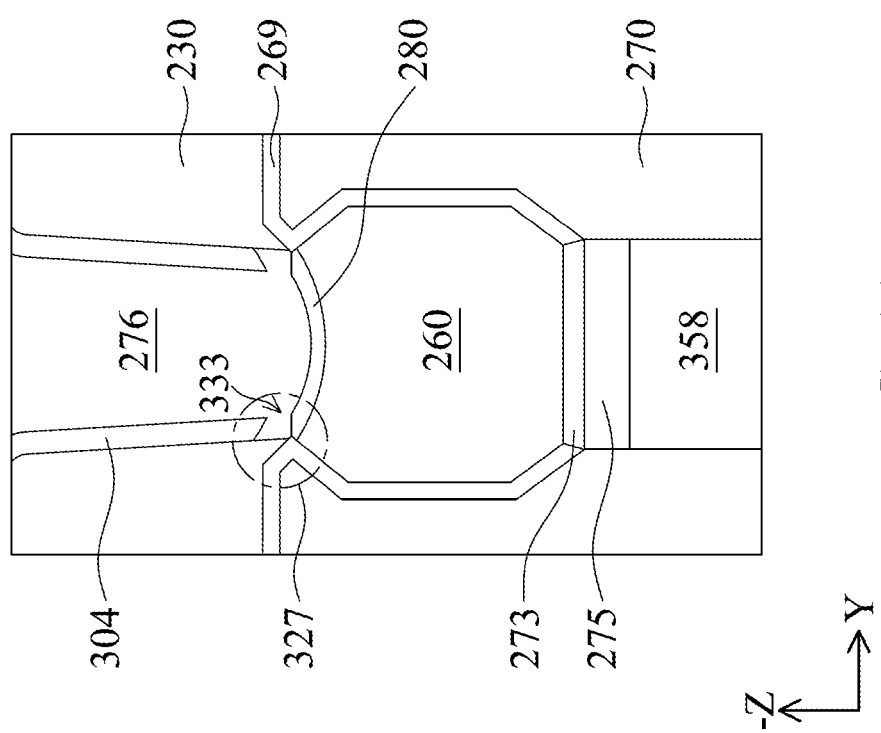
Figure 12B:
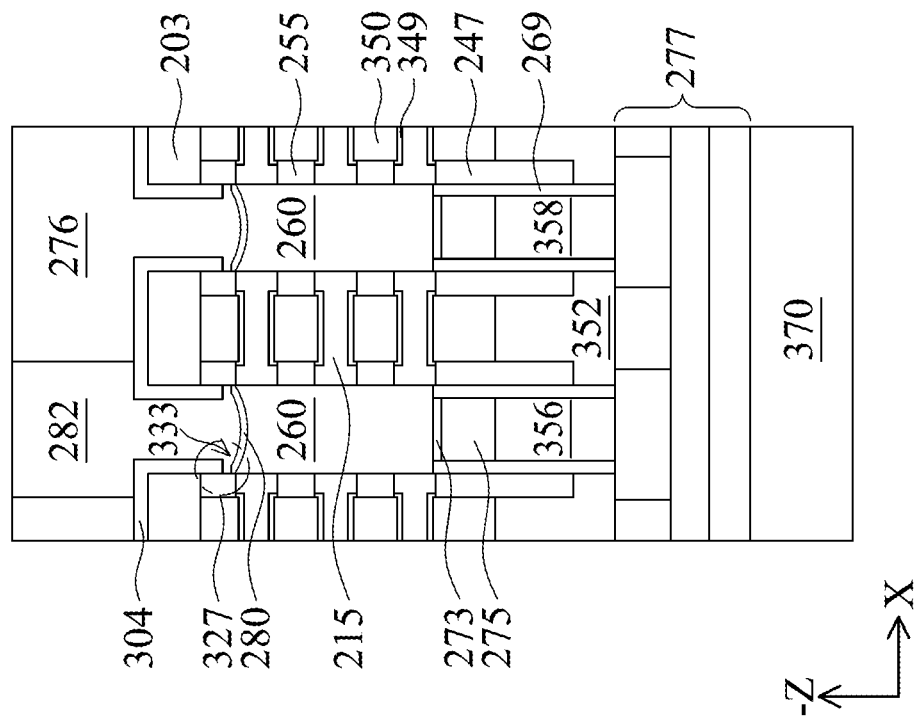
Figure 12A:
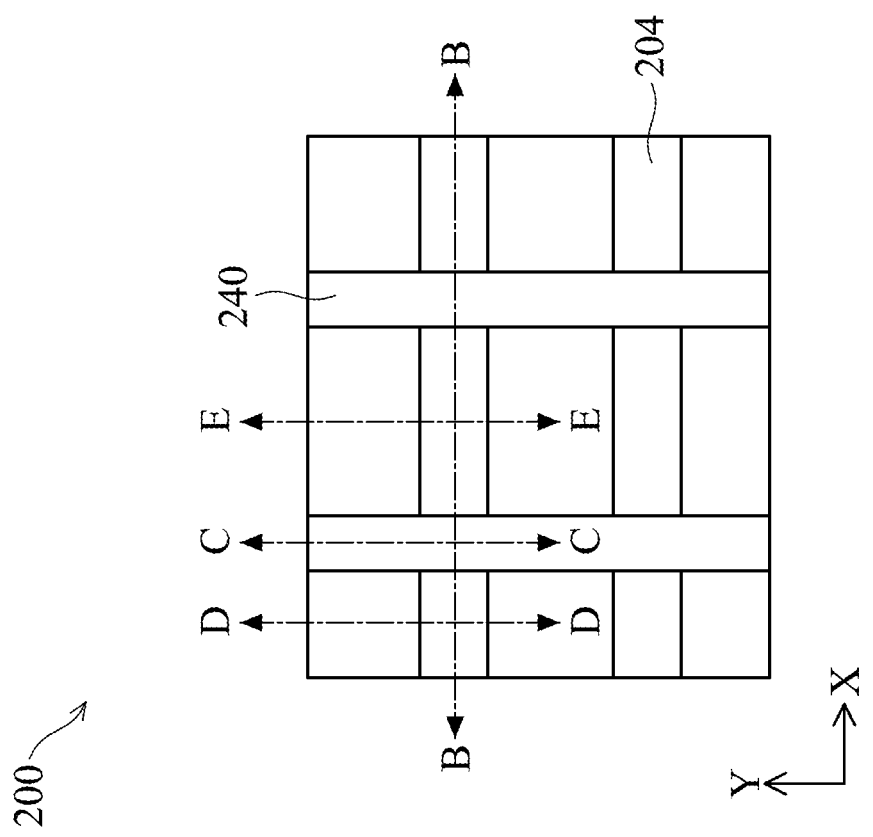
Figure 12D:
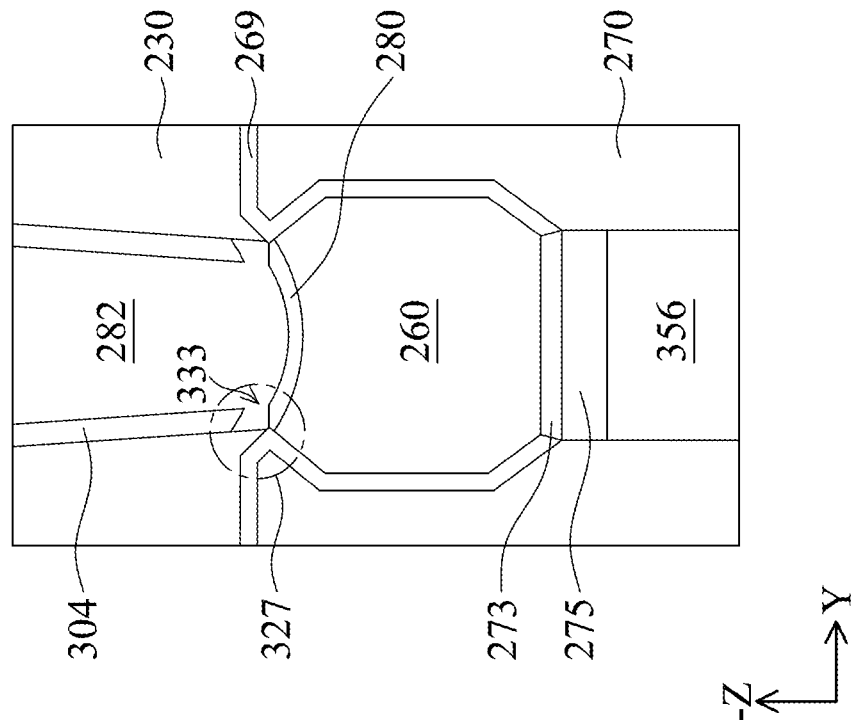
Figure 12C:
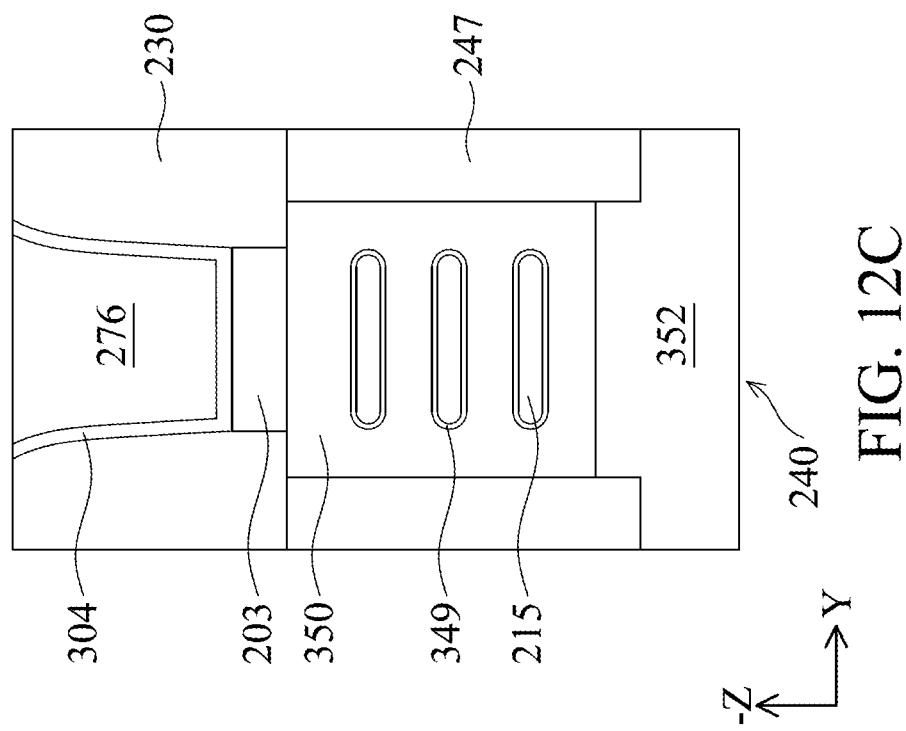
Figure 12E:
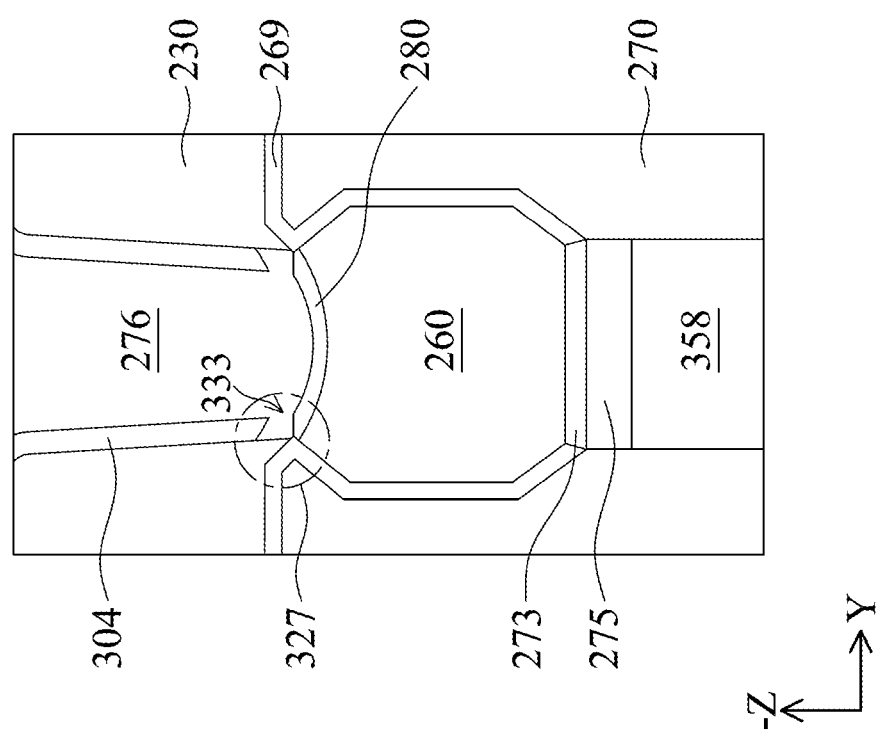

Referring to FIGS. 3A and 3B, the semiconductor device 200 further includes one or more interconnect layers (denoted with 277) with wires and vias embedded in dielectric layers. The one or more interconnect layers connecting gate, source, and drain electrodes of various transistors, as well as other circuits in the device 200, to form an integrated circuit in part or in whole. The semiconductor device 200 may further include passivation layers, adhesion layers, and/or other layers built on the frontside of the semiconductor device 200. These layers and the one or more interconnect layers are collectively denoted with the label 277. It is noted that the semiconductor device 200 is flipped upside down in FIG. 3B. The various elements of the semiconductor device 200 are further described below.

In an embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In an alternative embodiment, substrate 201 is a semiconductor-on-insulator substrate, such as a silicon-on-insulator (SOI) substrate, a silicon germanium-on-insulator (SGOI) substrate, or a germanium-on-insulator (GOI) substrate.

In embodiments, the semiconductor fin 204 may include silicon, silicon germanium, germanium, or other suitable semiconductor, and may be doped n-type or p-type dopants. The fin 204 may be patterned by any suitable method. For example, the fin 204 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fin 204. For example, the masking element may be used for etching recesses into semiconductor layers over or in the substrate 201, leaving the fin 204 on the substrate 201. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fin 204 may be suitable.

The isolation features 230 may include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures and/or deep trench isolation (DTI) structures. In an embodiment, the isolation features 230 can be formed by filling the trenches between fins 204 with insulator material (for example, by using a CVD process or a spin-on glass process), performing a chemical mechanical polishing (CMP) process to remove excessive insulator material and/or planarize a top surface of the insulator material layer, and etching back the insulator material layer to form isolation features 230. In some embodiments, isolation features 230 include a multi-layer structure, such as a silicon nitride layer disposed over a thermal oxide liner layer.

The S/D features 260 include epitaxially grown semiconductor materials such as epitaxially grown silicon, germanium, or silicon germanium. The S/D features 260 can be formed by any epitaxy processes including chemical vapor deposition (CVD) techniques (for example, vapor phase epitaxy and/or Ultra-High Vacuum CVD), molecular beam epitaxy, other suitable epitaxial growth processes, or combinations thereof. The S/D features 260 may be doped with n-type dopants and/or p-type dopants. In some embodiments, for n-type transistors, the S/D features 260 include silicon and can be doped with carbon, phosphorous, arsenic, other n-type dopant, or combinations thereof (for example, forming Si:C epitaxial S/D features, Si:P epitaxial S/D features, or Si:C:P epitaxial S/D features). In some embodiments, for p-type transistors, the S/D features 260 include silicon germanium or germanium, and can be doped with boron, other p-type dopant, or combinations thereof (for example, forming Si:Ge:B epitaxial S/D features). The S/D features 260 may include multiple epitaxial semiconductor layers having different levels of dopant density. In some embodiments, annealing processes (e.g., rapid thermal annealing (RTA) and/or laser annealing) are performed to activate dopants in the epitaxial S/D features 260.

In embodiments, the channel layers 215 includes a semiconductor material suitable for transistor channels, such as silicon, silicon germanium, or other semiconductor material(s). The channel layers 215 may be in the shape of rods, bars, sheets, or other shapes in various embodiments. In an embodiment, the channel layers 215 are initially part of a stack of semiconductor layers that include the channel layers 215 and other (sacrificial) semiconductor layers alternately stacked layer-by-layer. The sacrificial semiconductor layers and the channel layers 215 include different material compositions (such as different semiconductor materials, different constituent atomic percentages, and/or different constituent weight percentages) to achieve etching selectivity. During a gate replacement process to form the gate stack 240, the sacrificial semiconductor layers are selectively removed, leaving the channel layers 215 suspended over the semiconductor fin 204.

In some embodiments, the inner spacer layer 255 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the inner spacer layer 255 includes a low-k dielectric material, such as those described herein. The inner spacer layer 255 may be formed by deposition and etching processes. For example, after S/D trenches are etched and before the S/D features 260 are epitaxially grown from the S/D trenches, an etch process may be used to recess the sacrificial semiconductor layers between the adjacent channel layers 215 to form gaps vertically between the adjacent channel layers 215. Then, one or more dielectric materials are deposited (using CVD or ALD for example) to fill the gaps. Another etching process is performed to remove the dielectric materials outside the gaps, thereby forming the inner spacer layer 255.

In some embodiments, the B-SAC layer 203 may include one or more of $La_2O_3$, $Al_2O_3$, SiOCN, SiOC, SiCN, $SiO_2$, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, and other suitable material(s). In some embodiments, the B-SAC layer 203 may include a low-k dielectric material such as a dielectric material including Si, O, N, and C. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, or combinations thereof. The B-SAC layer 203 may be deposited using CVD, ALD, PVD, or oxidation. In an embodiment, the B-SAC layer 203 is initially deposited on the semiconductor fin 204 and is patterned using the same process that patterns the semiconductor fin 204. In another embodiment, a sacrificial semiconductor layer (such as SiGe) is initially deposited on the semiconductor fin 204 and is patterned using the same process that patterns the semiconductor fin 204. The sacrificial layer is removed and replaced with the B-SAC layer 203 during a gate replacement process that forms the gate stack 240. The B-SAC layer 203 serves to isolate the channel layers 215 and the gate stack 240 from the backside vias to be formed in subsequent processes. In some embodiments, the B-SAC layer 203 may have a thickness d5 in a range of 0.5 nm to about 50 nm. In some embodiment, if the B-SAC layer 203 is too thin (such as less than 0.5 nm), then it may not provide sufficient isolation to the channel layers 215 and the gate stack 240. In some embodiment, if the B-SAC layer 203 is too thick (such as more than 50 nm), then the backside vias would be long and the resistance thereof would be high, which will be further discussed later.

In the depicted embodiment, the gate stack 240 includes a gate dielectric layer 349 and the gate electrode 350. The gate dielectric layer 349 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, $BaZrO$, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate dielectric layer 349 may be formed by chemical oxidation, thermal oxidation, atomic layer deposition (ALD), chemical vapor deposition (CVD), and/or other suitable methods. In some embodiments, the gate stack 240 further includes an interfacial layer between the gate dielectric layer 349 and the channel layers 215. The interfacial layer may include silicon dioxide, silicon oxynitride, or other suitable materials. In some embodiments, the gate electrode layer 350 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. Since the gate stack 240 includes a high-k dielectric layer and metal layer(s), it is also referred to as a high-k metal gate.

In an embodiment, the gate spacer 247 includes a dielectric material such as a dielectric material including silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In embodiments, the gate spacer 247 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). For example, a dielectric layer including silicon and nitrogen, such as a silicon nitride layer, can be deposited over a dummy gate stack (which is subsequently replaced by the high-k metal gate 240) and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate stack 240. In embodiments, the gate spacer 247 may have a thickness of about 1 nm to about 40 nm, for example.

In some embodiments, the SAC layer 352 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The SAC layer 352 protects the gate stacks 240 from etching and CMP processes that are used for etching S/D contact holes. The SAC layer 352 may be formed by recessing the gate stacks 240 and optionally recessing the gate spacers 247, depositing one or more dielectric materials over the recessed gate stacks 240 and optionally over the recessed gate spacers 247, and performing a CMP process to the one or more dielectric materials. The SAC layer 352 may have a thickness in a range of about 3 nm to about 30 nm, for example.

In embodiments, the CESL 269 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods.

In some embodiments, the silicide features 273 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

In an embodiment, the S/D contacts 275 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the S/D contacts 275.

In some embodiments, the capping layer 356 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The capping layer 356 protects the S/D contacts 275 from etching and CMP processes and isolating the S/D contacts 275 from the interconnect structure formed thereon. The capping layer 356 may have a thickness in a range of about 3 nm to about 30 nm, for example. In some embodiments, the SAC layer 352 and the capping layer 356 include different materials to achieve etch selectivity, for example, during the formation of the capping layer 356.

In an embodiment, the S/D contact via 358 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the S/D contact via 358.

At operation 104, the method 100 (FIG. 1A) flips the device 200 upside down and attaches the frontside of the device 200 to a carrier 370, such as shown in FIG. 3B. This makes the device 200 accessible from the backside of the device 200 for further processing. The operation 104 may use any suitable attaching processes, such as direct bonding, hybrid bonding, using adhesive, or other bonding methods. The operation 104 may further include alignment, annealing, and/or other processes. The carrier 370 may be a silicon wafer in some embodiment. In FIGS. 2A-13E, the "z" direction points from the backside of the device 200 to the frontside of the device 200, while the "−z" direction points from the frontside of the device 200 to the backside of the device 200.

At operation 106, the method 100 (FIG. 1A) thins down the device 200 from the backside of the device 200 until the semiconductor fin 204 and the isolation structure 230 are exposed from the backside of the device 200. The resultant structure is shown in FIGS. 4A-4E according to an embodiment. For simplicity, FIGS. 4C, 4D, and 4E omit some features that are already shown in FIG. 4B, particularly the layer 277 and the carrier 370. The thinning process may include a mechanical grinding process and/or a chemical thinning process. A substantial amount of substrate material may be first removed from the substrate 201 during a mechanical grinding process. Afterwards, a chemical thinning process may apply an etching chemical to the backside of the substrate 201 to further thin down the substrate 201.

At operation 108, the method 100 (FIG. 1A) selectively etches the semiconductor layer 204 to form trenches 272 over the backside of the gate stack 240 and the S/D features 260. The trenches 272 expose surfaces of the S/D features 260 from the backside. In the present embodiment, the operation 108 further forms a silicide feature 280 over the surfaces of the S/D features 260. The resultant structure is shown in FIGS. 5A-5E according to an embodiment. In the present embodiment, the operation 108 applies an etching process that is tuned to be selective to the materials of the semiconductor layer 204 and with no (or minimal) etching to the gate stacks 240, the isolation structure 230, and the B-SAC layer 203. In the present embodiment, the etching process also etches the S/D features 260 to recess it to a level that is even with or below the interface between the isolation structure 230 and the CESL 269. This is for preparing the trenches 272 for subsequent liner deposition. In some embodiments, the operation 108 may apply more than one etching processes. For example, it may apply a first etching process to selectively remove the semiconductor fin 204, and then apply a second etching process to selectively recess the S/D features 260 to the desired level, where the first and the second etching processes use different etching parameters such as using different etchants. The etching process (es) can be dry etching, wet etching, reactive ion etching, or other etching methods. The B-SAC layer 203 protects the gate stack 240 from the one or more etching processes. In an embodiment, the operation 108 includes depositing one or more metals into the trenches 272, performing an annealing process to the device 200 to cause reaction between the one or more metals and the S/D features 260 to produce the silicide feature 280, and removing un-reacted portions of the one or more metals, leaving the silicide feature 280 in the trenches 272. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide feature 280 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), a combination thereof, or other suitable compounds.

At operation 110, the method 100 (FIG. 1A) selectively deposits an inhibitor 302 over the backside of the S/D features 260, more specifically, over the silicide feature 280 in the present embodiment. The resultant structure is shown in FIGS. 6A-6E according to an embodiment. The inhibitor 302 includes an organic or organic-like film that includes amphiphilic or amphiphilic-like molecules. Referring to FIGS. 6B-6E, the inhibitor 302 is deposited on the silicide feature 280, but not on the dielectric layers 230, 203, and 255. It is noted that the inhibitor 302 may or may not touch the CESL 269 and the isolation structure 230 in a corner area 327 where the S/D features 260 and/or the silicide features 280 meet the CESL 269 and the isolation structure 230. In an embodiment, the inhibitor 302 is deposited on the surface of the silicide feature 280 due to covalent bonds between the molecules of the silicide feature 280 and the molecules of the inhibitor 302. Such covalent bonds do not exist between the dielectric surfaces of the layers 230, 203, and 255 and the inhibitor 302. Thus, the inhibitor 302 is not deposited over these dielectric surfaces. The inhibitor 302 further has a hydrophobic property such that it is not attachable to a dielectric material (i.e., it repels the deposition of a dielectric material thereon), which will be further explained with reference to the operation 112. For example, the inhibitor 302 may include a compound of alkyl chain or carboxylic acid in some embodiment or may have a chemical formula of $SHCH_2C_6H_4CH_2SH$, or $HS-(CH_2)_n-COOH$ in some embodiment. The inhibitor 302 may be deposited using ALD, PVD, CVD, or other suitable methods and may have a thickness (along the "z" direction) of about 0.5 nm to 5 nm. In the present embodiment, the inhibitor 302 is deposited only on selected surfaces (i.e., the surfaces of the silicide feature 280) without involving a photolithography process. Thus, the operation 110 is a selective deposition process.

At operation 112, the method 100 (FIG. 1A) selectively deposits a dielectric liner layer 304 on the backside of the structure 200. The resultant structure is shown in FIGS. 7A-7E according to an embodiment. Referring to FIGS. 7A-7E, the dielectric liner layer 304 is deposited to have a substantially uniform thickness along the various surfaces of the B-SAC layer 203, the isolation structure 230, and the inner spacers 255 in this embodiment. Due to the hydrophobic property of the inhibitor 302, the dielectric liner layer 304 is not deposited on the inhibitor 302 except some edge areas of the inhibitor 302 (such as the portion of the inhibitor 302 in corner areas 327). The dielectric liner layer 304 may or may not touch the edge areas of the inhibitor 302. In various embodiment, the dielectric liner layer 304 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The dielectric liner layer 304 functions to isolate the S/D contacts (backside vias) that are to be formed in the trenches 272 later (see FIG. 12D). Without the dielectric liner layer 304, metals from the S/D contacts may diffuse into the isolation structure 230 over time to cause issues. The dielectric liner layer 304 also functions to isolation the S/D contacts from the nearby gate stacks 240. The dielectric liner layer 304 may be deposited using ALD, CVD, or other suitable methods, and may have a thickness of about 1 nm to about 5 nm (e.g., as measured on the sidewalls of the B-SAC layer 203 along the "x" direction) in various embodiments. In the present embodiment, the dielectric liner layer 304 is deposited only on selected surfaces (i.e., the surfaces of the isolation structure 230, the B-SAC layer 203, and the inner spacers 255) without involving a photolithography process. Thus, the operation 112 is a selective deposition process. Particularly, since the dielectric liner layer 304 is not deposited on the inhibitor 302, a vertical etching process for breaking down the dielectric liner layer 304 is not needed.

At operation 114, the method 100 (FIG. 1B) removes the inhibitor 302 from the device 200, particularly from the surfaces of the silicide feature 280. The resultant structure is shown in FIGS. 8A-8E according to an embodiment. Referring to FIGS. 8A-8E, the removal of the inhibitor 302 results in gaps (or voids) 333 in the corner areas 327. In the cross-sectional view of FIG. 8B, the gaps 333 exist directly below the dielectric liner layer 304 and above the S/D features 260 and the silicide feature 280 and expose a portion of the side surface of the inner spacers 255. In the cross-sectional view of FIGS. 8D and 8E, the gaps 333 exist directly below the dielectric liner layer 304 and above the silicide feature 280 and expose a portion of the side surface of the isolation structure 230 and/or the CESL 269. In various embodiments, a distance d2 between the bottom surface of the dielectric liner layer 304 and the top surface of the silicide feature 280 is in a range of about 0.2 nm to about 5 nm. The distance d2 is the height of the gaps 333. If the distance d2 is smaller than 0.2 nm, it will become more difficult for backside S/D contacts (or S/D via) such as the S/D via 282 (see FIG. 12D) to fill in the gap, reducing the interfacial area between the S/D contact 282 and the S/D features 260 (and the silicide feature 280) and increasing S/D contact resistance. If the distance d2 is greater than 5 nm, then there may be areas on the isolation structure 230, the B-SAC layer 203, and/or the inner spacers 255 that are not sufficiently covered by the dielectric liner 304, leading to metal diffusion from the S/D contacts 282 into these dielectric layers. Therefore, having the distance d2 in the range of 0.2 nm to 5 nm achieves a good balance between reducing S/D contact resistance and improving S/D contact isolation.

In an embodiment, the removal of the inhibitor 302 includes a plasma dry etching process, a chemical dry etching process, an ashing process, a wet etching process, or a combination thereof. The etching and ashing processes are selective to the materials of the inhibitor 302 and have no (or minimal) etching to the dielectric liner layer 304, the CESL 269, the inner spacer 255, the isolation structure 230, the silicide features 280, and the S/D features 260. For example, the plasma dry etching process may use conventional dry etchant for dielectric material such as $C_4F_6$ mixed with $H_2$ or $O_2$, the chemical dry etching process may use one or more chemicals such as $H_2$, the ashing process may use oxygen or hydrogen ashing, and the wet etching process may apply a hot SPM solution (a mixture of sulfuric acid and hydrogen peroxide), for example, at a temperate above 100° C.

As a result of the operations 110, 112, and 114, the backside surfaces of the silicide feature 280 are exposed in the trenches 272 and the dielectric liner layer 304 is disposed over various surfaces of the isolation structure 230, the B-SAC layer 203, and the inner spacers 255. In approaches that do not use the inhibitor 302 (i.e., omitting the operation 110 and 114), the dielectric liner layer 304 would be deposited not only on the surfaces of the layers 230, 203, and 255, but also on the silicide feature 280. In order to expose the S/D features 260 and/or the silicide feature 280 for subsequent S/D contact formation, an etching process would be performed to etch the dielectric liner layer 304. Sometimes, to ensure that the dielectric liner layer 304 is completely removed from the surfaces of the S/D features 260 or the silicide feature 280, an over-etching would be performed. The over-etching may lead to unnecessary loss of the B-SAC layer 203 as well as the S/D features 260 or the silicide feature 280. Loss or thinning of the B-SAC layer 203 may lead to short circuit between the gate stack 240 and the backside vias (such as the via 282 in FIG. 12D). In contrast, by using the inhibitor 302, processes according to the present embodiment are more robust and have better control on the thickness of the B-SAC layer 203. Further, due to the presence of the gaps 333, there are more areas of the S/D features 206 and the silicide feature 280 for making S/D contacts, thereby reducing S/D contact resistance.

At operation 116, the method 100 (FIG. 1B) deposits a dielectric layer 276 with one or more dielectric materials to fill the trenches 272. In the present embodiment, the operation 116 performs a CMP process to the dielectric layer 276 and the dielectric liner layer 304 to remove them from the top surface of the isolation structure 230. The resultant structure is shown in FIGS. 9A-9E according to an embodiment. Referring to FIGS. 9A-9E, the dielectric layer 276 is deposited over the dielectric liner layer 304 and the silicide feature 280, and fills the gaps 333. In some embodiments, the dielectric layer 276 may include one or more of $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). Further, in the present embodiment, the dielectric layer 276 and the dielectric liner 304 include different materials to achieve etch selectivity during the backside contact hole etching process. Still further, the dielectric layer 276 and the isolation structure 230 may include different materials so that the isolation structure 230 may act as a CMP stop when the dielectric layer 276 is planarized by the CMP process.

At operation 118, the method 100 (FIG. 1B) forms an etch mask 360 over the backside of the structure 200. The etch mask 360 provides openings 362 over the backside of the S/D features 260 that are to be connected to backside vias. The resultant structure is shown in FIGS. 10A-10E according to an embodiment. Referring to FIGS. 10A-10E, in the depicted embodiment, the opening 362 is provided over the backside of the source feature 260 while the backside of the gate stack 240 and the drain feature 260 are covered by the etch mask 360. In various embodiments, the openings 362 may be provided over the backside of drain features only, source features only, or both source and drain features. The etch mask 360 includes a material that is different than a material of the dielectric layer 276 to achieve etching selectivity during backside via hole etching. For example, the etch mask 360 includes a resist material (and thus may be referred to as a patterned resist layer and/or a patterned photoresist layer). In some embodiments, the etch mask 360 has a multi-layer structure, such as a resist layer disposed over an anti-reflective coating (ARC) layer and/or a hard mask layer comprising silicon nitride or silicon oxide. The present disclosure contemplates other materials for the etch mask 360, so long as etching selectivity is achieved during the etching of the dielectric layer 276. In some embodiments, operation 118 uses a lithography process that includes forming a resist layer over the backside of the device 200 (e.g., by spin coating), performing a pre-exposure baking process, performing an exposure process using a mask, performing a post-exposure baking process, and performing a developing process. During the exposure process, the resist layer is exposed to radiation energy (e.g., UV light, DUV light, or EUV light), where the mask blocks, transmits, and/or reflects radiation to the resist layer depending on a mask pattern of the mask and/or mask type (e.g., binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer (e.g., the etch mask 360) includes a resist pattern that corresponds with the mask. Alternatively, the exposure process can be implemented or replaced by other methods, such as maskless lithography, e-beam writing, ion-beam writing, or combinations thereof.

At operation 120, the method 100 (FIG. 1B) etches the dielectric layer 276 through the etch mask 360 to form a via hole 278. The etch mask 360 is subsequently removed, for example, by a resist stripping process or other suitable process. The resultant structure is shown in FIGS. 11A-11E according to an embodiment. Referring to FIGS. 11A-11E, the via hole 278 exposes the silicide feature 280 on the source feature 260 in the depicted embodiment. Particularly, the gaps 333 re-appear in the corner areas 327 inside the via hole 278. In an embodiment, the etching processes include a dry (plasma) etching process that is tuned to selectively etch the dielectric layer 276 and with no (or minimal) etching to the dielectric liner 304, the isolation structure 230, the CESL 269, the inner spacers 255, the silicide feature 280, and the S/D features 260. In alternative embodiments, the operation 120 may use other types of etching (such as wet etching or reactive ion etching) as long as the etch selectivity between the layers is achieved as discussed above. Since the operation 120 has no or minimal etching to the isolation structure 230 and the dielectric liner 304, the via hole etching is self-aligned to the dielectric liner 304 in the y-z plane and in the x-z plane, thereby improving the process margin.

At operation 122, the method 100 (FIG. 1B) forms a via structure (or via or metal plug) 282 in the via hole 278. The resultant structure is shown in FIGS. 12A-12E according to an embodiment. Referring to FIGS. 12A-12E, the via 282 is disposed over the silicide feature 280.

In an embodiment, the via 282 may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be formed by CVD, PVD, ALD, plating, or other suitable processes. The operation 122 may perform a CMP process to remove excessive materials of the via 282.

Figure 13B:
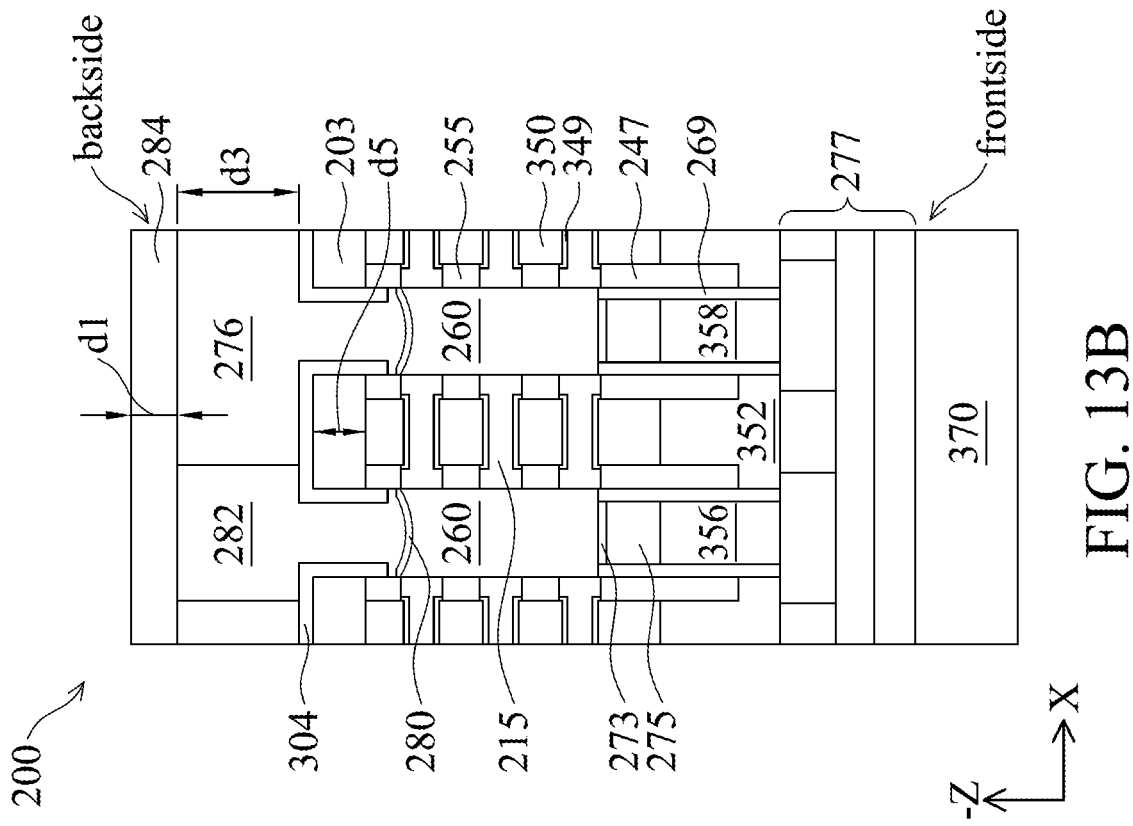
Figure 13A:
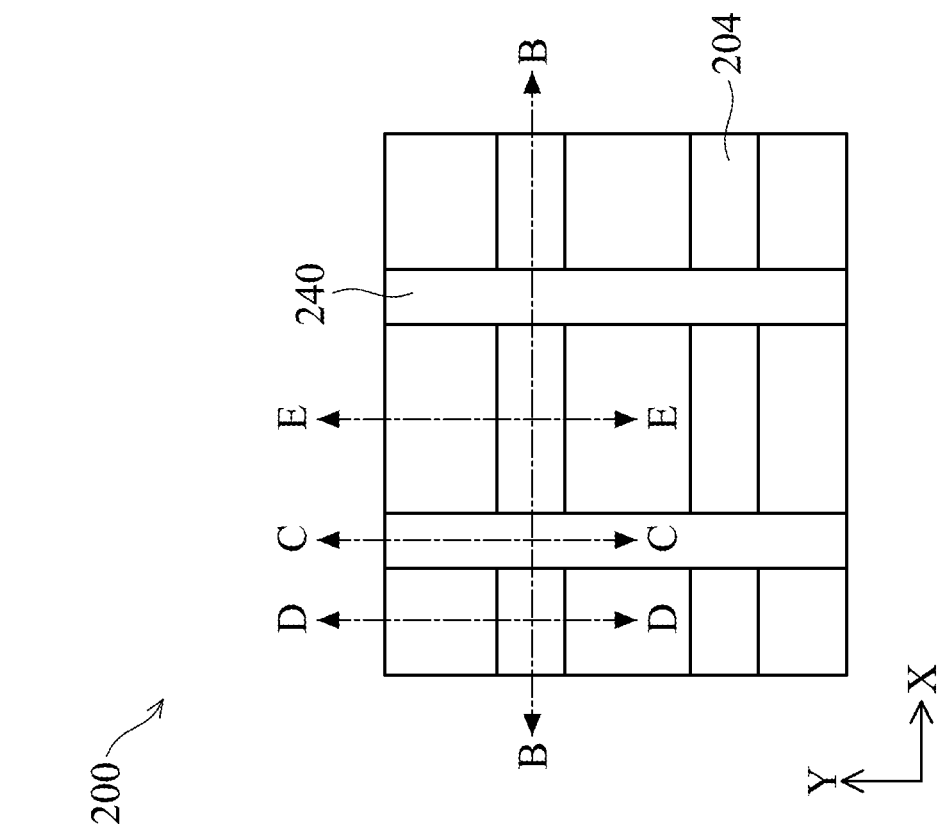
Figure 13E:
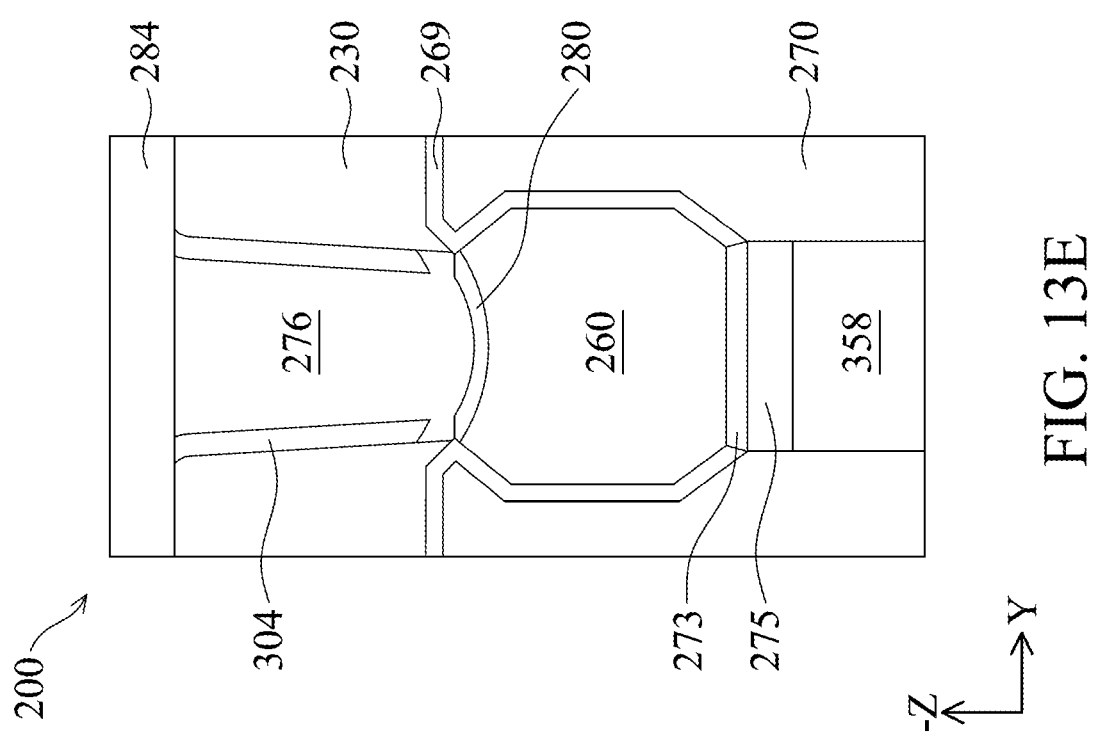

At operation 124, the method 100 (FIG. 1B) forms backside power rails 284. The resultant structure is shown in FIGS. 13A-13B according to an embodiment. As illustrated in FIGS. 13B-13E, the backside via 282 is electrically connected to the backside power rails 284. In an embodiment, the backside power rails 284 may be formed using a damascene process, a dual-damascene process, a metal patterning process, or other suitable processes. The backside power rails 284 may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be deposited by CVD, PVD, ALD, plating, or other suitable processes. Although not shown in FIGS. 13A-13E, the backside power rails 284 are embedded in one or more dielectric layers. Having backside power rails 284 beneficially increases the number of metal tracks available in the device 200 for directly connecting to source/drain contacts and vias. It also increases the gate density for greater device integration than other structures without the backside power rails 284. The backside power rails 284 may have wider dimension than the first level metal (M0) tracks on the frontside of the device 200, which beneficially reduces the backside power rail resistance. In an embodiment, the backside power rails 284 may have a thickness d1 in a range from about 5 nm to about 40 nm, for example; the dielectric layer 276 may have a thickness d3 in a range from about 3 nm to about 50 nm, for example; and the B-SAC layer 203 has a thickness d5 in a range from about 0.5 nm to about 50 nm, as discussed above.

At operation 126, the method 100 (FIG. 1B) performs further fabrication processes to the device 200. For example, it may form one or more interconnect layers on the backside of the structure 200, form passivation layers on the backside of the device 200, perform other BEOL processes, and remove the carrier 370.

Although not intended to be limiting, embodiments of the present disclosure provide one or more of the following advantages. For example, embodiments of the present disclosure form a liner layer for a backside via where the liner layer is selectively deposited on sidewalls of a via hole but not on the bottom of the via hole. This eliminates the need to break through the liner when subsequently forming the via in the via hole and advantageously reduces the risk of shorting metal gates to the backside via. Also, embodiments of the present disclosure form backside vias using a self-aligned process, which minimize the risks of the shorting the backside vias to nearby conductors including the gate stacks. Further, embodiments of the present disclosure form backside power rails to increase the number of metal tracks available in an integrated circuit and increase the gate density for greater device integration. Embodiments of the present disclosure can be readily integrated into existing semiconductor manufacturing processes.

In one example aspect, the present disclosure is directed to a method that includes providing a structure having a frontside and a backside. The structure includes a substrate, a semiconductor fin over the substrate, two source/drain (S/D) features over the semiconductor fin, a first dielectric layer over the semiconductor fin, an isolation structure adjacent to sidewalls of the semiconductor fin, one or more channel semiconductor layers over the first dielectric layer and connecting the two S/D features, and a gate structure engaging the one or more channel semiconductor layers. The substrate is at the backside of the structure and the gate structure is at the frontside of the structure. The method further includes thinning down the structure from the backside of the structure until the semiconductor fin is exposed and selectively etching the semiconductor fin from the backside of the structure to form a trench. The trench exposes surfaces of the two S/D features, a surface of the first dielectric layer, and sidewalls of the isolation structure. The method further includes forming a silicide feature on the surfaces of the S/D features and selectively depositing an inhibitor in the trench. The inhibitor is deposited on the silicide feature but not on the surface of the first dielectric layer and the sidewalls of the isolation structure. The method further includes selectively depositing a dielectric liner layer in the trench. The dielectric liner layer is deposited on the sidewalls of the isolation structure and the surface of the first dielectric layer but not on the inhibitor. The method further includes selectively removing the inhibitor.

In an embodiment, the method further includes depositing a second dielectric layer to fill the trench; etching the second dielectric layer to form a via hole, the via hole exposing the silicide feature on one of the two S/D features and the dielectric liner layer; and forming a via structure in the via hole. In a further embodiment, before the etching of the second dielectric layer, the method includes forming an etch mask on the backside of the structure. The etch mask provides an opening over a portion of the second dielectric layer that is below one of the two S/D features, wherein the etching of the second dielectric layer is performed through the opening. In a further embodiment, at least a portion of the via structure is formed vertically between the one of the two S/D features and the dielectric liner layer.

In some embodiments of the method, the silicide feature includes titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or a combination thereof.

In some embodiments of the method, the inhibitor includes an organic film having amphiphilic molecules and the dielectric liner layer includes at least one of $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, and ZrSi.

In some embodiments of the method, the selectively removing of the inhibitor uses an etching process that is tuned to etch the inhibitor with no or minimal etching to the dielectric liner layer. In a further embodiment, the selectively removing of the inhibitor includes plasma dry etching, chemical dry etching, ashing, wet etching, or a combination thereof. In a further embodiment, the selectively removing of the inhibitor includes a wet etching with SPM cleaning solution at a temperature over 100° C.

In another example aspect, the present disclosure is directed to a method that includes providing a structure having a substrate, a semiconductor fin over the substrate, two source/drain (S/D) features over the semiconductor fin, an isolation structure on sidewalls of the semiconductor fin, a dielectric capping layer over the semiconductor fin, one or more channel semiconductor layers over the dielectric capping layer, and a gate structure engaging the one or more channel semiconductor layers. The method further includes thinning down the substrate until the semiconductor fin is exposed and selectively etching the semiconductor fin to form a trench. The trench exposes surfaces of the two S/D features, a surface of the dielectric capping layer, and sidewalls of the isolation structure. The method further includes forming a silicide feature on the surfaces of the S/D features; depositing an inhibitor on the silicide feature but not on the surface of the dielectric capping layer and the sidewalls of the isolation structure; depositing a dielectric liner layer on the sidewalls of the isolation structure and the surface of the dielectric capping layer but not on the inhibitor; selectively removing the inhibitor; and forming a via structure in the trench.

In an embodiment, after the selectively removing of the inhibitor and before the forming of the via structure, the method further includes depositing a dielectric layer to fill the trench and etching the dielectric layer to form a via hole. The via hole exposes the silicide feature on one of the two S/D features and the via structure is formed in the via hole. In a further embodiment, before the etching of the dielectric layer, the method includes forming an etch mask on a backside of the structure. The etch mask provides an opening over a portion of the dielectric layer, and the etching of the dielectric layer is performed through the opening.

In an embodiment of the method, the silicide feature includes titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), and cobalt silicide (CoSi), or a combination thereof.

In some embodiments of the method, the inhibitor includes an organic film having amphiphilic molecules and the dielectric liner layer includes at least one of $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, and ZrSi.

In some embodiments of the method, the selectively removing of the inhibitor includes plasma dry etching, chemical dry etching, ashing, wet etching, or a combination thereof.

In yet another example aspect, the present disclosure is directed to a semiconductor structure. The semiconductor structure includes two source/drain (S/D) features; one or more channel semiconductor layers connecting the two S/D features; and a gate structure engaging the one or more channel semiconductor layers. The two S/D features, the one or more channel semiconductor layer, and the gate structure are at a frontside of the semiconductor structure. The semiconductor structure further includes a metal track at a backside of the semiconductor structure; a first dielectric layer between the metal track and the one or more channel semiconductor layers; a dielectric liner layer on surfaces of the first dielectric layer and spaced away from one of the two S/D features by a first gap; and a via structure connecting the metal track to one of the two S/D features, wherein a portion of the via structure is disposed in the first gap.

In an embodiment of the semiconductor structure, the dielectric liner layer is spaced away from another one of the two S/D features by a second gap. In a further embodiment, the semiconductor structure includes a second dielectric layer over the dielectric liner layer, wherein a portion of the second dielectric layer extends from the metal track to the other one of the two S/D features and fills the second gap.

In an embodiment, the semiconductor structure further includes a silicide feature between the via structure and the one of the two S/D features. In another embodiment, the semiconductor structure further includes a second dielectric layer over the dielectric liner layer and between the first dielectric layer and the metal track.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a source/drain (S/D) feature;
   a channel layer connected to the S/D feature between a first side of the S/D feature and a second side of the S/D feature;

a gate structure engaging the channel layer;
an interconnect structure over the first side of the S/D feature;
a silicide feature directly on the second side of the S/D feature; and
a dielectric liner layer over the second side of the S/D feature and on a sidewall of the gate structure, wherein the dielectric liner layer is spaced away from the silicide feature by a first gap.

2. The semiconductor structure of claim 1, wherein a height of the first gap is in a range of about 0.2 nm to about 5 nm.

3. The semiconductor structure of claim 1, wherein the dielectric liner layer includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, or ZrSi.

4. The semiconductor structure of claim 3, wherein the dielectric liner layer has a thickness of about 1 nm to about 5 nm.

5. The semiconductor structure of claim 1, further comprising a via structure in contact with the silicide feature, wherein a portion of the via structure is disposed in the first gap.

6. The semiconductor structure of claim 5, further comprising a metal track in contact with the via structure.

7. The semiconductor structure of claim 1, further comprising a first dielectric layer at the second side of the S/D feature and in contact with the silicide feature, wherein a portion of the first dielectric layer is disposed in the first gap.

8. The semiconductor structure of claim 7, wherein the dielectric liner layer and the first dielectric layer comprise different materials.

9. A semiconductor structure, comprising:
a source/drain (S/D) feature;
one or more channel semiconductor layers connected to the S/D feature;
a gate structure engaging the one or more channel semiconductor layers;
an interconnect structure on a frontside of the S/D feature and the gate structure;
a first dielectric layer directly below the gate structure;
a second dielectric layer on a sidewall of the gate structure;
a silicide feature at on a backside of the S/D feature; and
a dielectric liner layer on a sidewall of the first and the second dielectric layers, below the silicide feature, and spaced away from the silicide feature by a first gap.

10. The semiconductor structure of claim 9, wherein the dielectric liner layer is spaced away from another S/D feature by a second gap.

11. The semiconductor structure of claim 10, wherein a height of the first gap is in a range of about 0.2 nm to about 5 nm, and a height of the second gap is in a range of about 0.2 nm to about 5 nm.

12. The semiconductor structure of claim 10, further comprising
a third dielectric layer on the silicide feature, wherein a portion of the third dielectric layer is between the dielectric liner layer and the silicide feature and filling the second gap.

13. The semiconductor structure of claim 12, wherein the third dielectric layer and the dielectric liner layer comprise different materials.

14. The semiconductor structure of claim 12, wherein the third dielectric layer directly contacts the silicide feature.

15. The semiconductor structure of claim 9, further comprising:
a source/drain via contacting the silicide feature, wherein a conductive material of the source/drain via fills the first gap.

16. The semiconductor structure of claim 15, wherein the dielectric liner layer directly contacts the source/drain via.

17. A semiconductor structure, comprising:
a source/drain (S/D) feature;
a gate structure adjacent the S/D feature;
an interconnect structure on a frontside of the S/D feature and the gate structure;
one or more dielectric layers laterally between the S/D feature and the gate structure;
a silicide feature on a backside of the S/D feature; and
a dielectric liner layer on a sidewall of the one or more dielectric layers, below the silicide feature, and spaced away from the silicide feature by a first gap.

18. The semiconductor structure of claim 17, wherein the interconnect structure includes a plurality of metal layers and interposing insulating layers.

19. The semiconductor structure of claim 17, wherein the first gap is filled with dielectric material.

20. The semiconductor structure of claim 17, wherein the first gap is filled with conductive material of a source/drain via.

* * * * *